US012593572B2

(12) United States Patent
Lee et al.

(10) Patent No.: US 12,593,572 B2
(45) Date of Patent: Mar. 31, 2026

(54) DISPLAY APPARATUS INCLUDING A FIRST ELECTRODE ON THE FIRST INORGANIC INSULATING LAYER AND ELECTRICALLY CONNECTED TO THE FIRST METAL LAYER AND METHOD OF MANUFACTURING THE SAME

(71) Applicant: Samsung Display Co., Ltd., Yongin-si (KR)

(72) Inventors: Jaehyun Lee, Yongin-si (KR); Seulki Kim, Yongin-si (KR); Seungha Choi, Yongin-si (KR); Kapsoo Yoon, Yongin-si (KR); Woogeun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 558 days.

(21) Appl. No.: 17/968,609

(22) Filed: Oct. 18, 2022

(65) Prior Publication Data
US 2023/0137236 A1     May 4, 2023

(51) Int. Cl.
*H01L 29/08* (2006.01)
*G09G 3/3233* (2016.01)
(Continued)

(52) U.S. Cl.
CPC ......... *H10K 59/123* (2023.02); *G09G 3/3233* (2013.01); *H10K 59/1213* (2023.02);
(Continued)

(58) Field of Classification Search
CPC ............. H10K 59/123; H10K 59/1213; H10K 59/1216; H10K 59/1201; H10K 71/00;
(Continued)

(56) References Cited

U.S. PATENT DOCUMENTS 10,032,405 B2    7/2018   Jeong et al.
10,317,763 B2    6/2019   Watakabe et al.
(Continued)

FOREIGN PATENT DOCUMENTS

EP          3896736 A1 * 10/2021   ........... H10D 86/451
JP       2018-74076 A     5/2018
(Continued)

*Primary Examiner* — Phuc T Dang
(74) *Attorney, Agent, or Firm* — Womble Bond Dickinson (US) LLP

(57) ABSTRACT

A display apparatus includes: a substrate; a semiconductor layer on the substrate, formed of an oxide semiconductor, and including a channel semiconductor layer and a first semiconductor layer extending in a first direction from the channel semiconductor layer; a first metal layer on the first semiconductor layer, and located in the first semiconductor layer in a plan view; a first inorganic insulating layer covering the semiconductor layer and the first metal layer and including a first contact hole overlapping the first semiconductor layer and the first metal layer; a first electrode on the first inorganic insulating layer, overlapping the first semiconductor layer and the first metal layer, and electrically connected to the first metal layer and the first semiconductor layer connected to the first metal layer through the first contact hole.

12 Claims, 31 Drawing Sheets

(51) Int. Cl.

| | |
|---|---|
| *H10K 59/121* | (2023.01) |
| *H10K 59/123* | (2023.01) |
| *H10K 71/00* | (2023.01) |
| *H10D 30/67* | (2025.01) |
| *H10D 86/40* | (2025.01) |
| *H10D 86/60* | (2025.01) |
| *H10K 59/12* | (2023.01) |

(52) U.S. Cl.
CPC ......... *H10K 59/1216* (2023.02); *H10K 71/00* (2023.02); *G09G 2300/0426* (2013.01); *G09G 2300/0819* (2013.01); *G09G 2300/0842* (2013.01); *H10D 30/6755* (2025.01); *H10D 86/423* (2025.01); *H10D 86/481* (2025.01); *H10D 86/60* (2025.01); *H10K 59/1201* (2023.02)

(58) Field of Classification Search
CPC ......... G09G 3/3233; G09G 2300/0426; G09G 2300/0819; G09G 2300/0842; H10D 86/481; H10D 86/423

USPC ........................................................ 257/40
See application file for complete search history.

(56) References Cited

U.S. PATENT DOCUMENTS

| | | | |
|---|---|---|---|
| 10,446,591 | B2 | 10/2019 | Kwon |
| 10,930,723 | B2 | 2/2021 | Shim et al. |
| 11,557,642 | B2 | 1/2023 | Lee et al. |
| 11,839,110 | B2 | 12/2023 | Lee et al. |
| 2019/0181207 | A1 | 6/2019 | Kim et al. |
| 2020/0091264 | A1 | 3/2020 | Lee et al. |
| 2021/0183975 | A1 | 6/2021 | Lee et al. |

FOREIGN PATENT DOCUMENTS

| | | | | | |
|---|---|---|---|---|---|
| KR | 10-2017-0115641 | A | | 10/2017 | |
| KR | 10-2020-0032594 | A | | 3/2020 | |
| KR | 10-2092034 | B1 | | 3/2020 | |
| KR | 10-2021-0076515 | A | | 6/2021 | |
| KR | 20210064921 | A | * | 6/2021 | ............ H10D 86/40 |
| KR | 10-2021-0086441 | A | | 7/2021 | |

* cited by examiner

DISPLAY APPARATUS INCLUDING A FIRST ELECTRODE ON THE FIRST INORGANIC INSULATING LAYER AND ELECTRICALLY CONNECTED TO THE FIRST METAL LAYER AND METHOD OF MANUFACTURING THE SAME

CROSS-REFERENCE TO RELATED APPLICATION

This application claims priority to and the benefit of Korean Patent Application No. 10-2021-0149949, filed on Nov. 3, 2021, in the Korean Intellectual Property Office (KIPO), the entire disclosure of which is incorporated by reference herein.

BACKGROUND

1. Field

One or more embodiments relate to a display apparatus and a method of manufacturing the same.

2. Description of the Related Art

Display apparatuses visually display data. A display apparatus may be used as a display for a small product such as a mobile phone or may be used as a display for a large product such as a television.

A display apparatus may include a liquid crystal display apparatus that uses light from a backlight unit without self-emitting light, or may include a light-emitting display apparatus including a display element that emits light. The display element may include an emission layer. The display apparatus may be formed by alternately stacking a conductive layer and an insulating layer.

The above information disclosed in this Background section is for enhancement of understanding of the background of the present disclosure, and therefore, it may contain information that does not constitute prior art.

SUMMARY

Aspects of one or more embodiments of the present disclosure are directed to a display apparatus having a stacked structure (e.g., a simple stacked structure) and high reliability, and a method of manufacturing the display apparatus.

However, the embodiments are examples and do not limit the scope of the present disclosure.

Additional aspects will be set forth in part in the description which follows and, in part, will be apparent from the description, or may be learned by practice of the presented embodiments.

According to one or more embodiments, a display apparatus includes a substrate, a semiconductor layer on the substrate, formed of an oxide semiconductor, and including a channel semiconductor layer and a first semiconductor layer extending in a first direction from the channel semiconductor layer, a first metal layer on the first semiconductor layer, and located in the first semiconductor layer in a plan view, a first inorganic insulating layer covering the semiconductor layer and the first metal layer and including a first contact hole overlapping the first semiconductor layer and the first metal layer, a first electrode on the first inorganic insulating layer, overlapping the first semiconductor layer and the first metal layer, and electrically connected to the first metal layer and the first semiconductor layer connected to the first metal layer through the first contact hole, a gate electrode on the first inorganic insulating layer and overlapping the channel semiconductor layer, a second inorganic insulating layer covering the first electrode and the gate electrode, and a display element on the second inorganic insulating layer.

A portion of the first semiconductor layer under a region where the first metal layer is located may be non-conductive.

The first metal layer may be connected to the first electrode. The first electrode may be connected to a first wiring.

The first electrode may extend in an extension direction of the first wiring. The first metal layer may extend in the extension direction of the first electrode.

The first electrode may cover the first contact hole entirely in a plan view.

The first electrode and the gate electrode may include a same material.

The semiconductor layer may further include a second semiconductor layer extending from the channel semiconductor layer in a second direction opposite the first direction. The first inorganic insulating layer may further include a second contact hole overlapping the second semiconductor layer. The display apparatus further includes: a second metal layer on the second semiconductor layer and located in the second semiconductor layer in a plan view, and a second electrode on the second inorganic insulating layer, overlapping the second semiconductor layer and the second metal layer, and electrically connected to the second metal layer and the second semiconductor layer connected to the second metal layer through the second contact hole. One of the first electrode and the second electrode is electrically connected to the display element through a hole formed in the second inorganic insulating layer.

The display apparatus may further include a buffer layer between the substrate and the semiconductor layer, a first capacitor electrode between the substrate and the buffer layer, and a second capacitor electrode between the buffer layer and the first inorganic insulating layer and overlapping the first capacitor electrode. The second capacitor electrode includes a first layer including a same material as a material of the semiconductor layer, and a second layer on the first layer and including a same material as a material of the first metal layer.

A portion of the first layer under the second layer may be non-conductive.

The display apparatus may further include a third capacitor electrode between the buffer layer and the second inorganic insulating layer and overlapping the second capacitor electrode. The third capacitor electrode includes a same material as a material of the gate electrode.

The third capacitor electrode may be electrically connected to the first capacitor electrode.

The display apparatus may further include a fourth capacitor electrode on the second inorganic insulating layer and overlapping the third capacitor electrode. The display element includes a pixel electrode on the second inorganic insulating layer. The fourth capacitor electrode includes a same material as a material of the pixel electrode.

According to one or more embodiments, a method of manufacturing a display apparatus includes forming, on a substrate, a semiconductor layer formed of an oxide semiconductor and including a channel semiconductor layer and a first semiconductor layer adjacent to the channel semiconductor layer, and a first metal layer on the semiconductor layer and located in an outer circumference of the first semiconductor layer in a plan view, forming a first inorganic insulating layer covering the semiconductor layer and the first metal layer, forming a contact hole in the first inorganic insulating layer, the contact hole overlapping a part of the semiconductor layer, and forming, on the first inorganic insulating layer, a first electrode electrically connected to the first metal layer and the first semiconductor layer connected to the first metal layer through the contact hole, and a gate electrode spaced from the first electrode and overlapping the channel semiconductor layer.

A portion of the first semiconductor layer under a region where the first metal layer is located may be non-conductive.

The first electrode may cover the contact hole entirely.

The forming of the semiconductor layer and the first metal layer may include forming a first layer including an oxide semiconductor on the substrate, forming a second layer including a metal on the first layer, forming a photoresist on the second layer, etching the second layer, etching the photoresist, etching the first layer, and striping the photoresist.

The forming of the photoresist on the second layer may include forming the photoresist to have a first photoresist region having a first thickness from a surface of the second layer and a second photoresist region having a second thickness from the surface of the second layer, the second thickness being less than the first thickness.

The first photoresist region may overlap a region where the first metal layer is formed.

The second photoresist region may overlap a region where the channel semiconductor layer is formed.

The etching of the photoresist may include etching the photoresist until the second photoresist region is removed.

The method may further include etching the second layer again, after the etching of the first layer.

The method may further include forming, on the substrate, a first capacitor electrode and a buffer layer covering the first capacitor electrode, before the forming the semiconductor layer and the first metal layer, wherein the forming of the semiconductor layer and the first metal layer includes forming a second capacitor electrode including a third semiconductor layer including a same material as a material of the semiconductor layer and a third metal layer including a same material as a material of the first metal layer.

The forming the first electrode and the gate electrode may include forming a third capacitor electrode including a same material as a material of the first electrode and the gate electrode.

Other aspects, features, and effects of the disclosure will become more apparent from the detailed description, the claims, and the drawings.

BRIEF DESCRIPTION OF THE DRAWINGS

The above and other aspects, features, and advantages of certain embodiments will be more apparent from the following description taken in conjunction with the accompanying drawings, in which.

4

Figure 3:
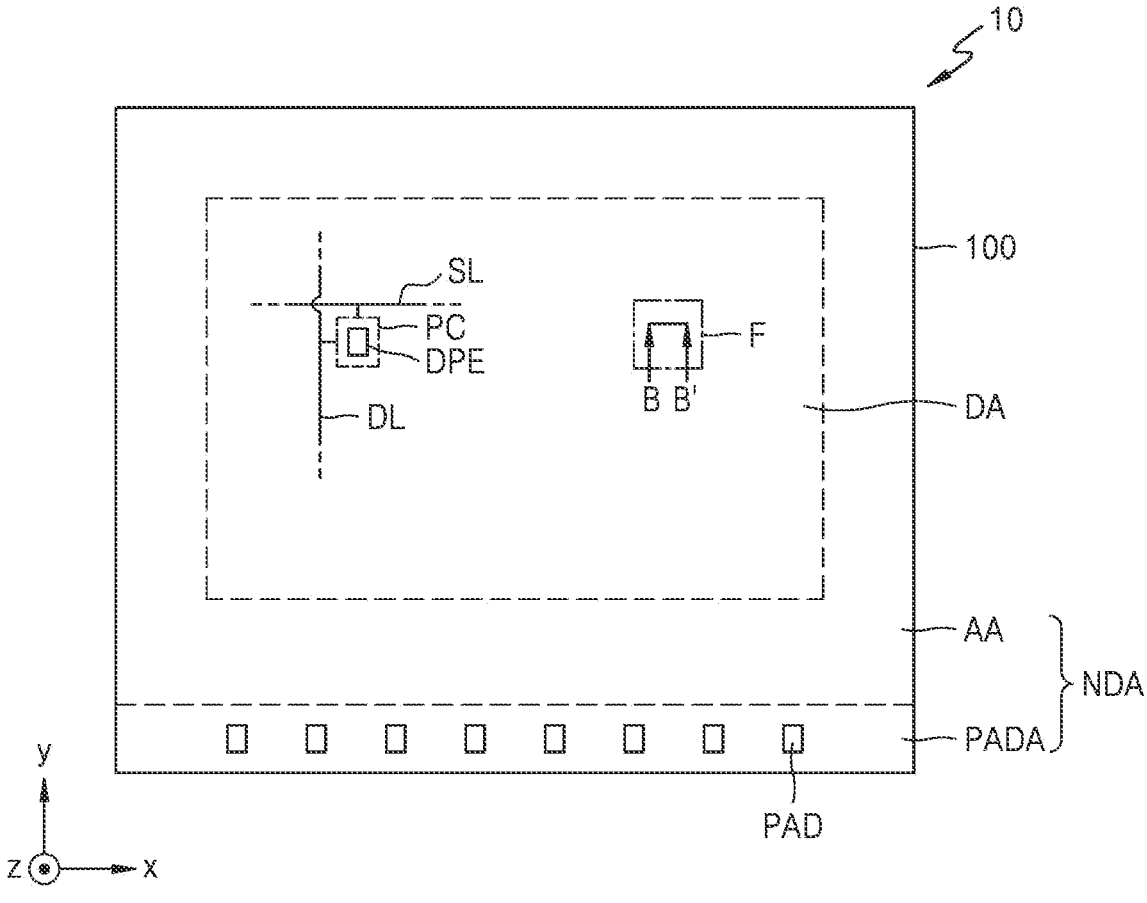
FIG. 3 is a plan view illustrating a light-emitting panel according to one or more embodiments.
Figure 4:
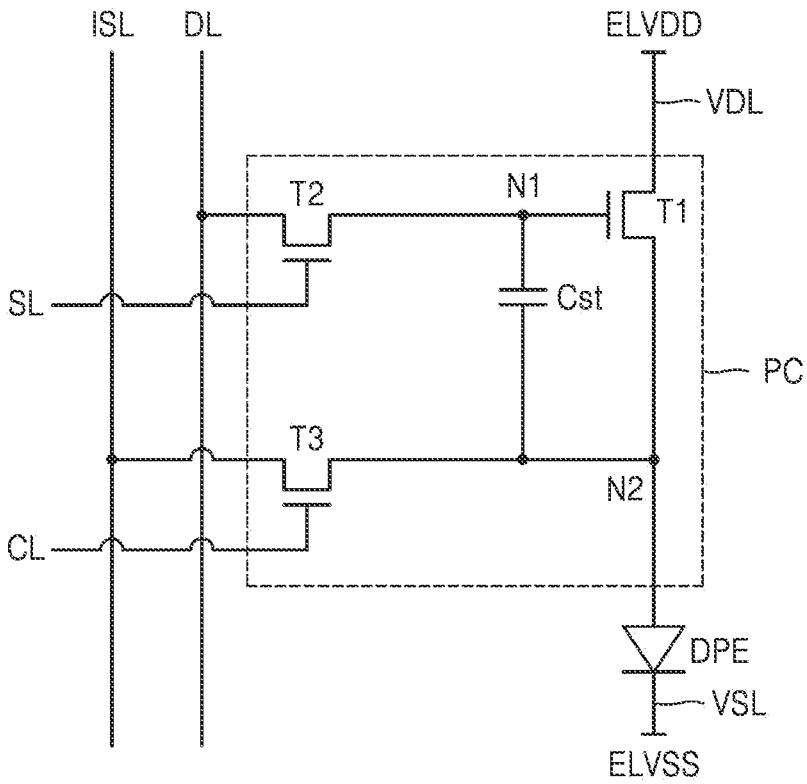
Figure 5A:
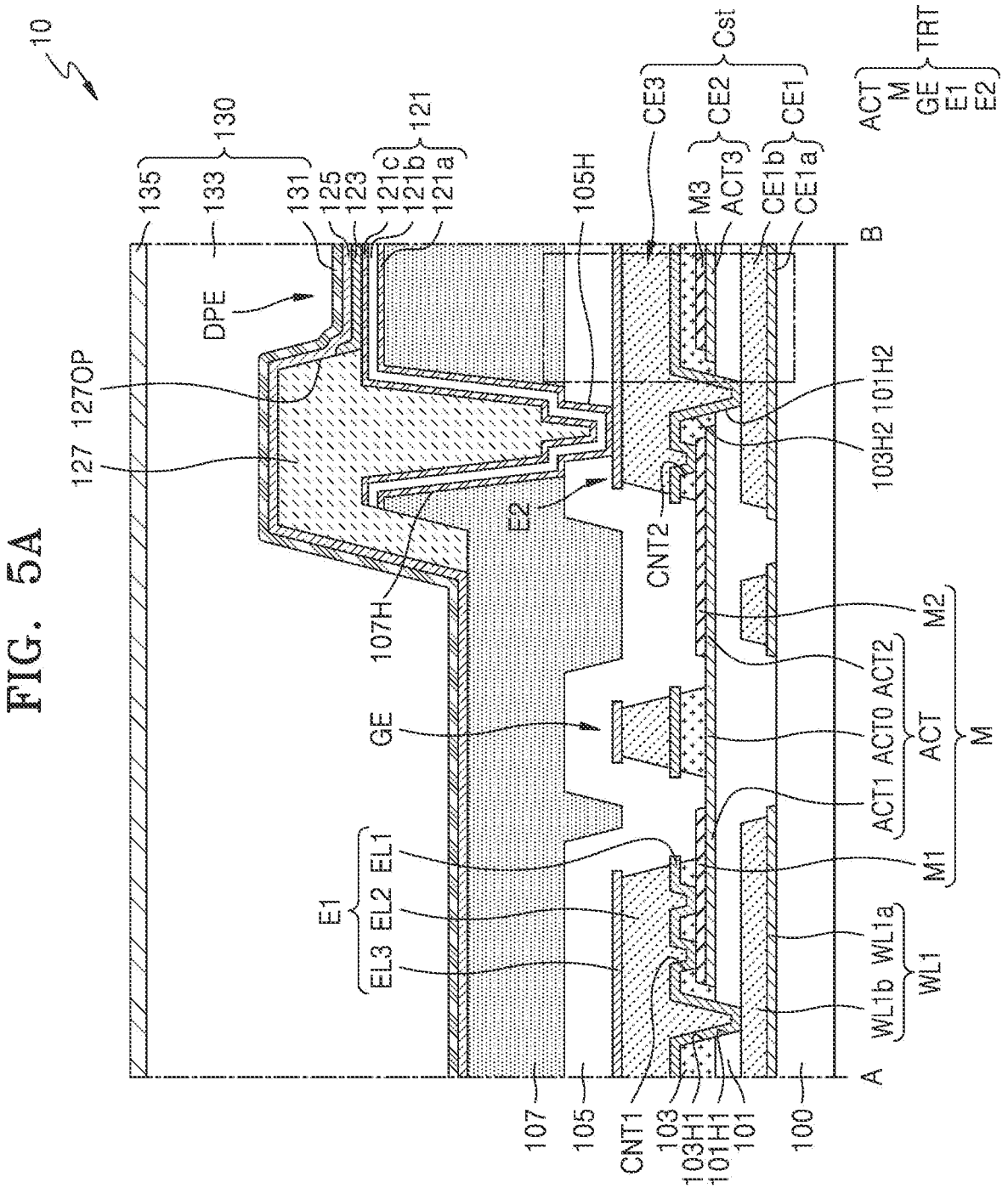
Figure 5B:
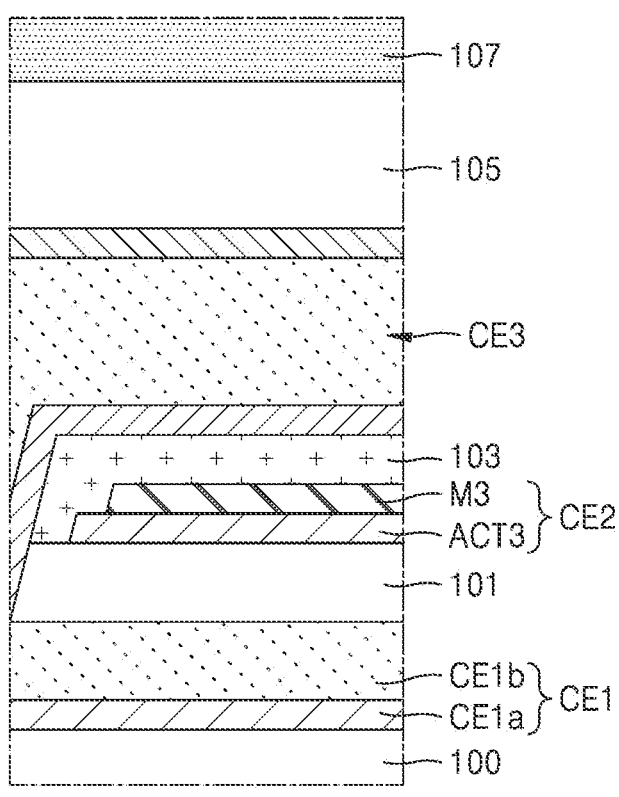
Figure 5C:
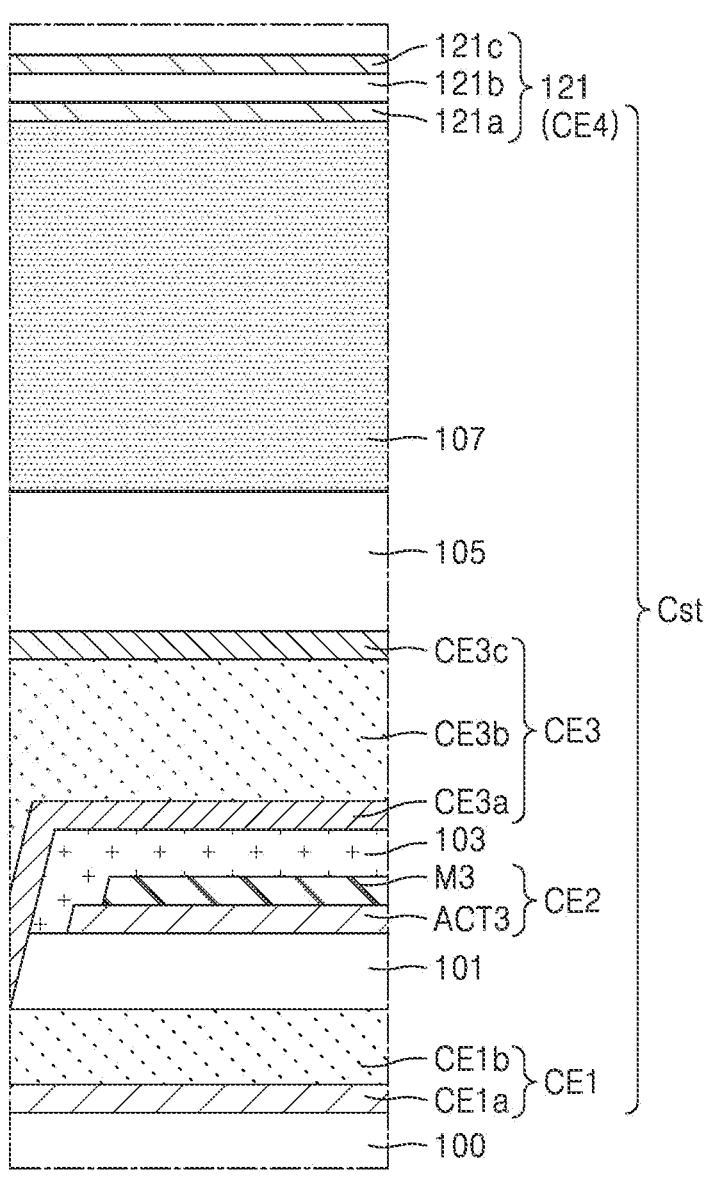
Figure 5D:
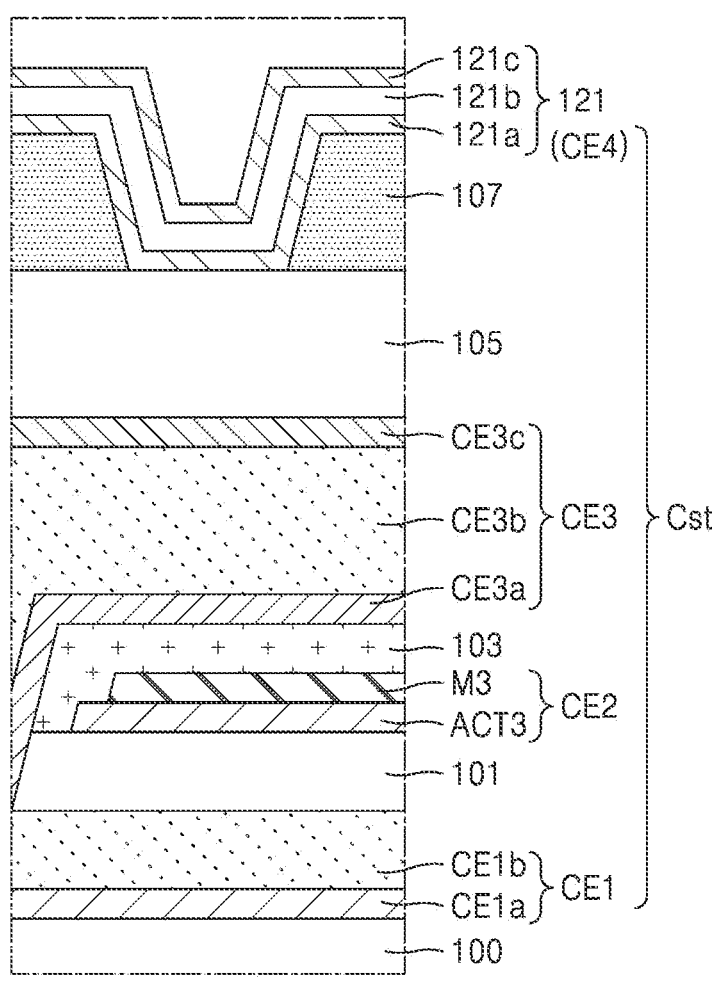
Figure 6A:
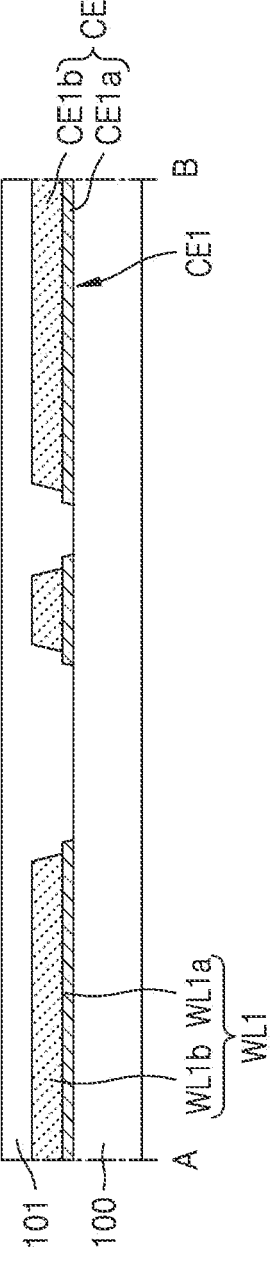
Figure 6B:
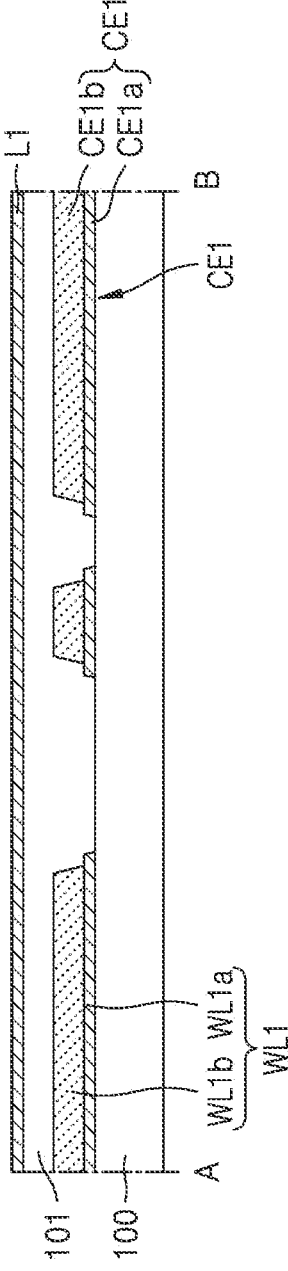
Figure 6C:
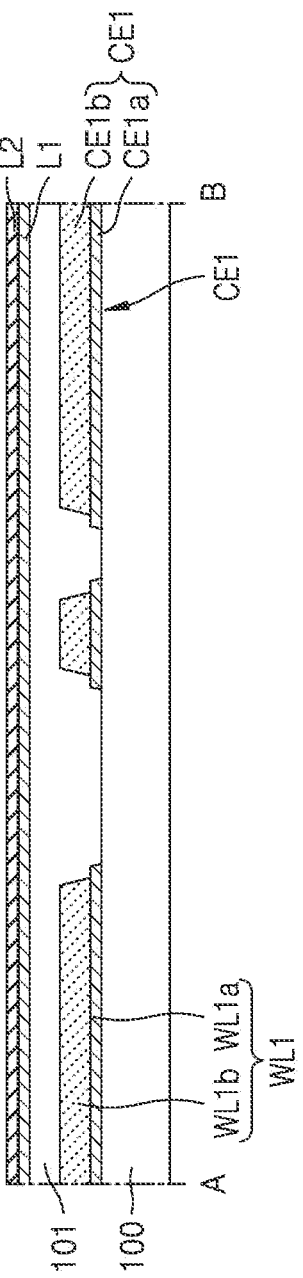
Figure 6D:
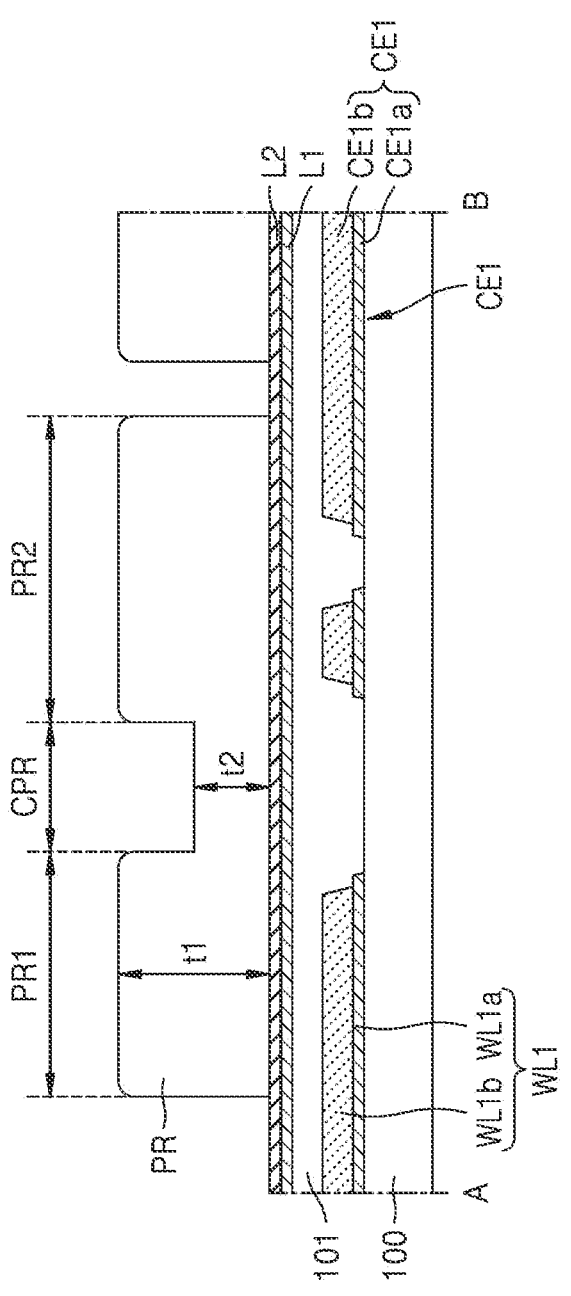
Figure 6E:
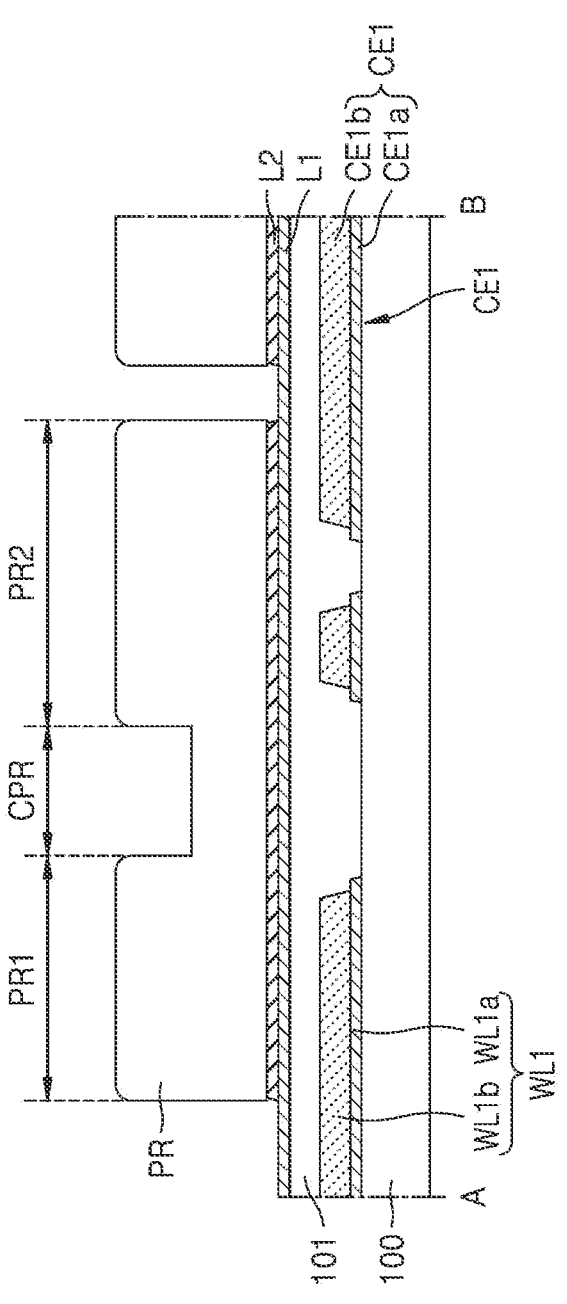
Figure 6F:
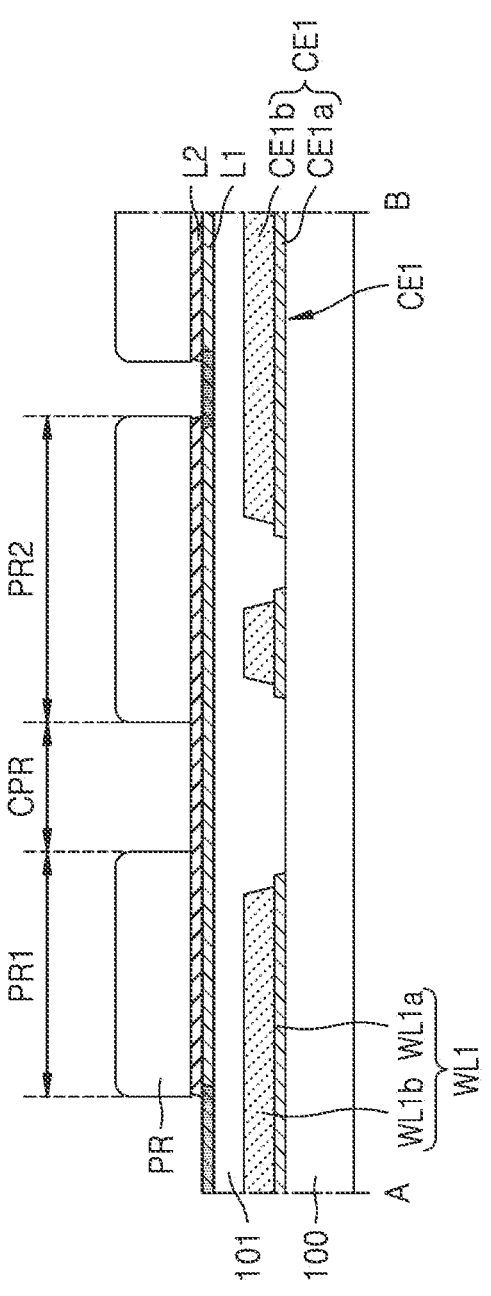
Figure 6G:
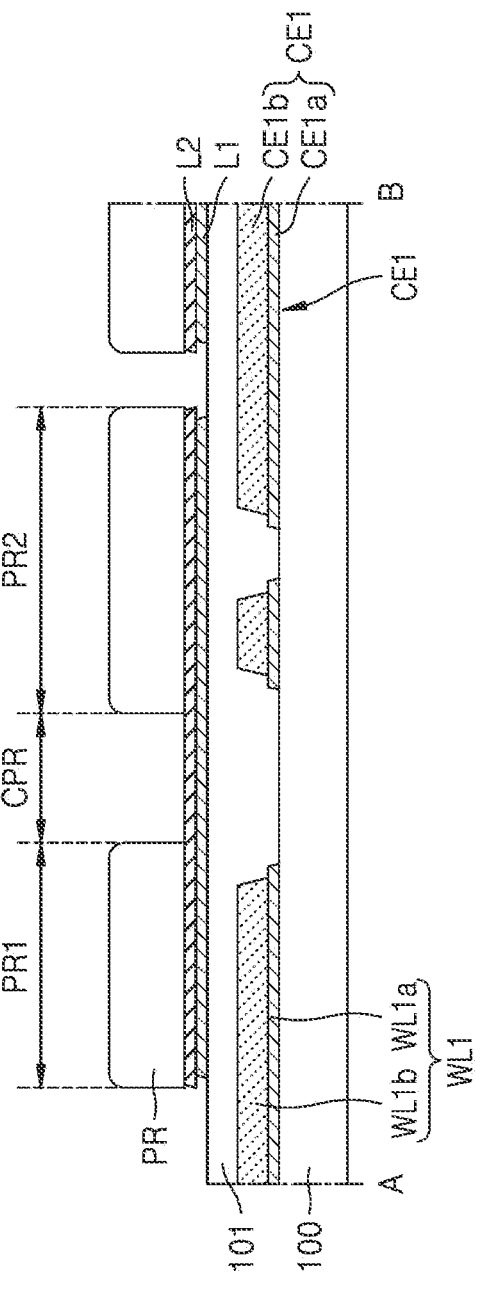
Figure 6H:
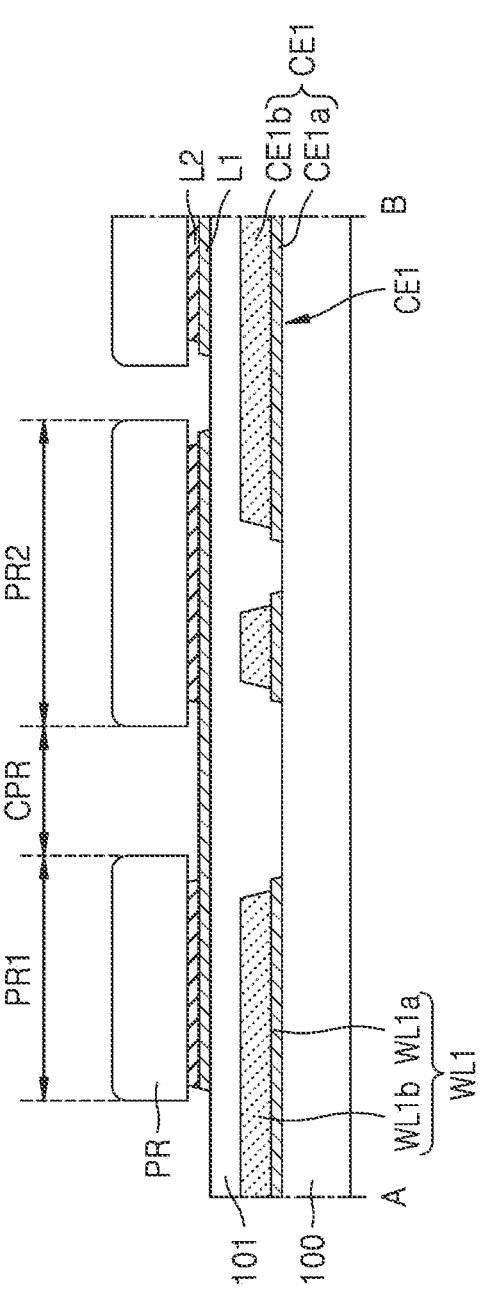
Figure 61:
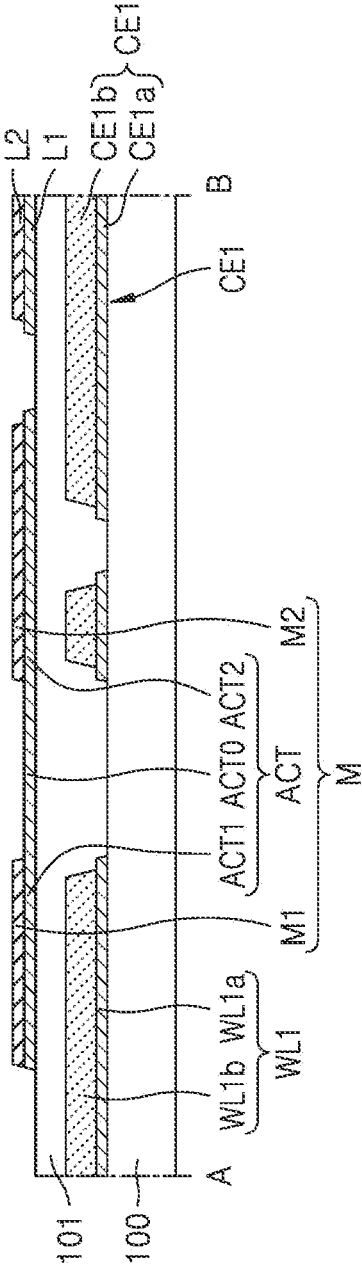
Figure 6J:
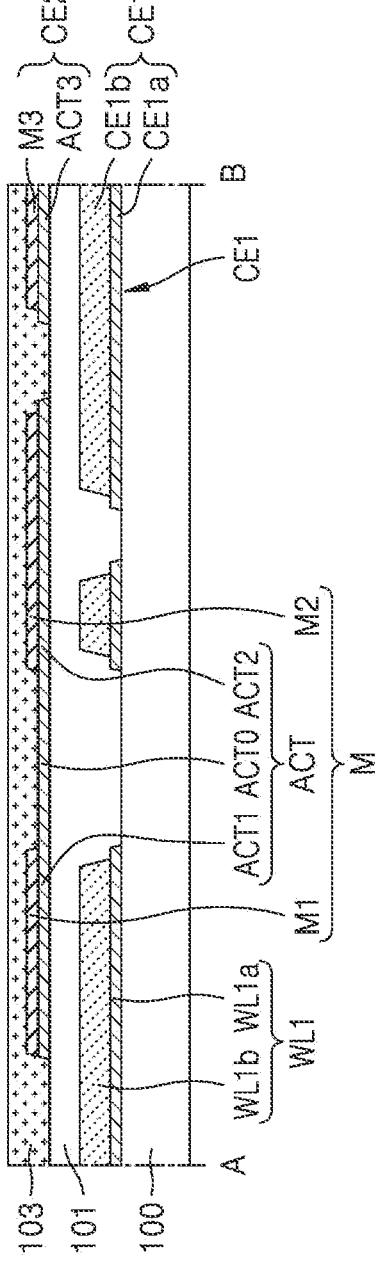
Figure 6K:
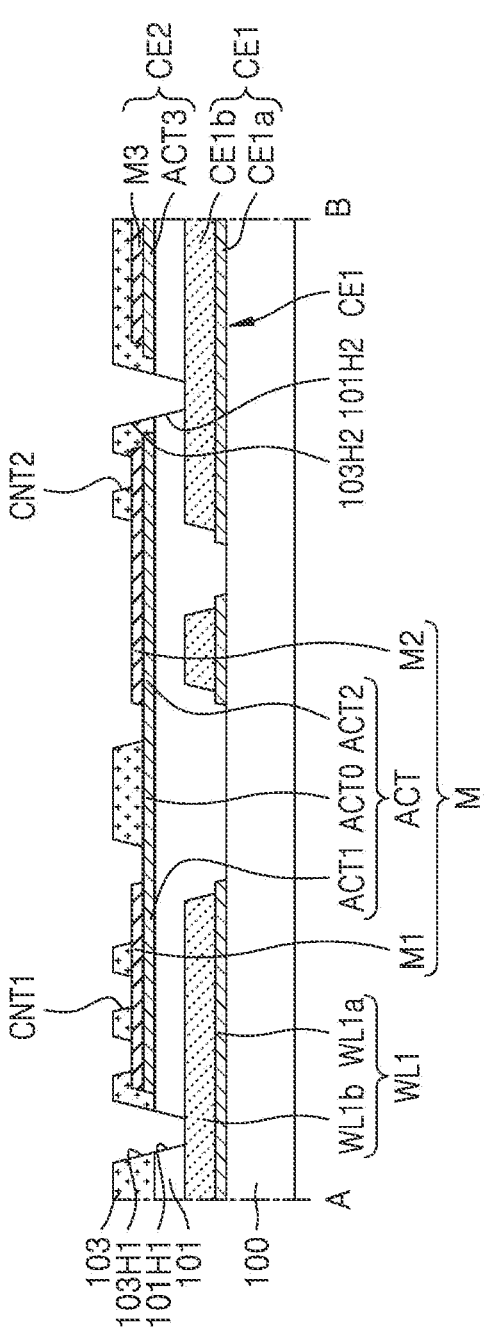
Figure 6L:
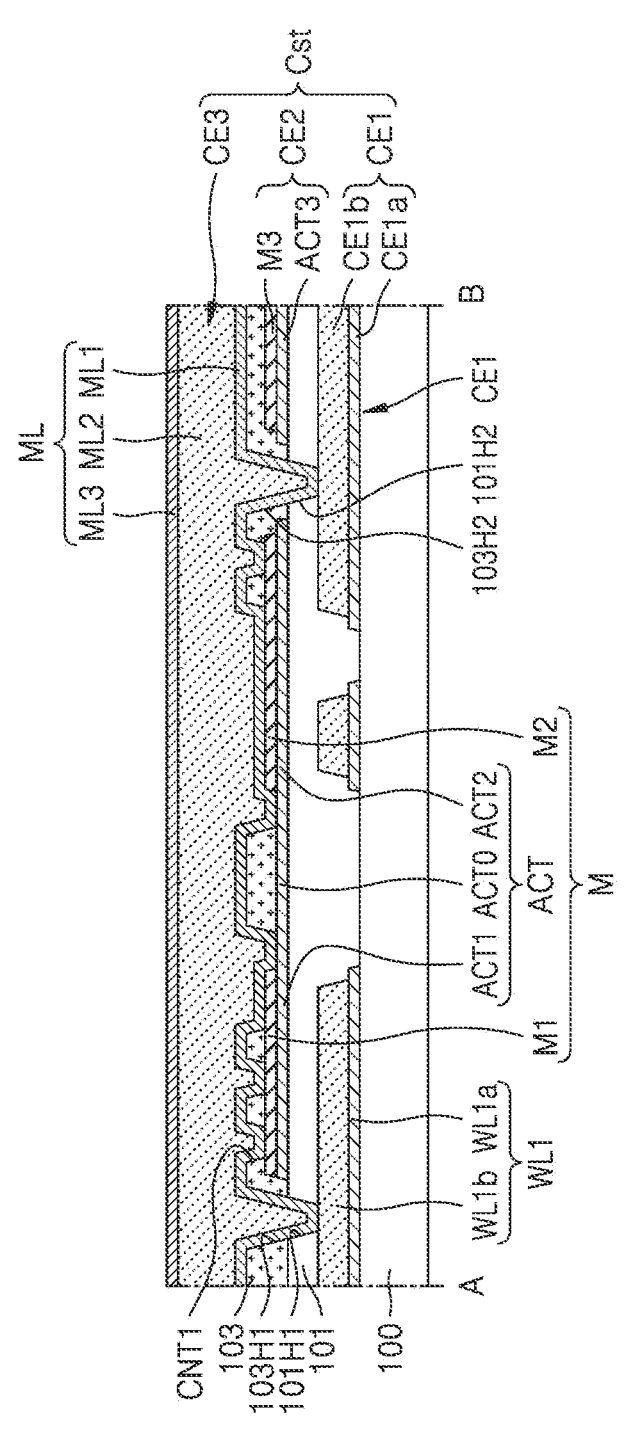
Figure 6M:
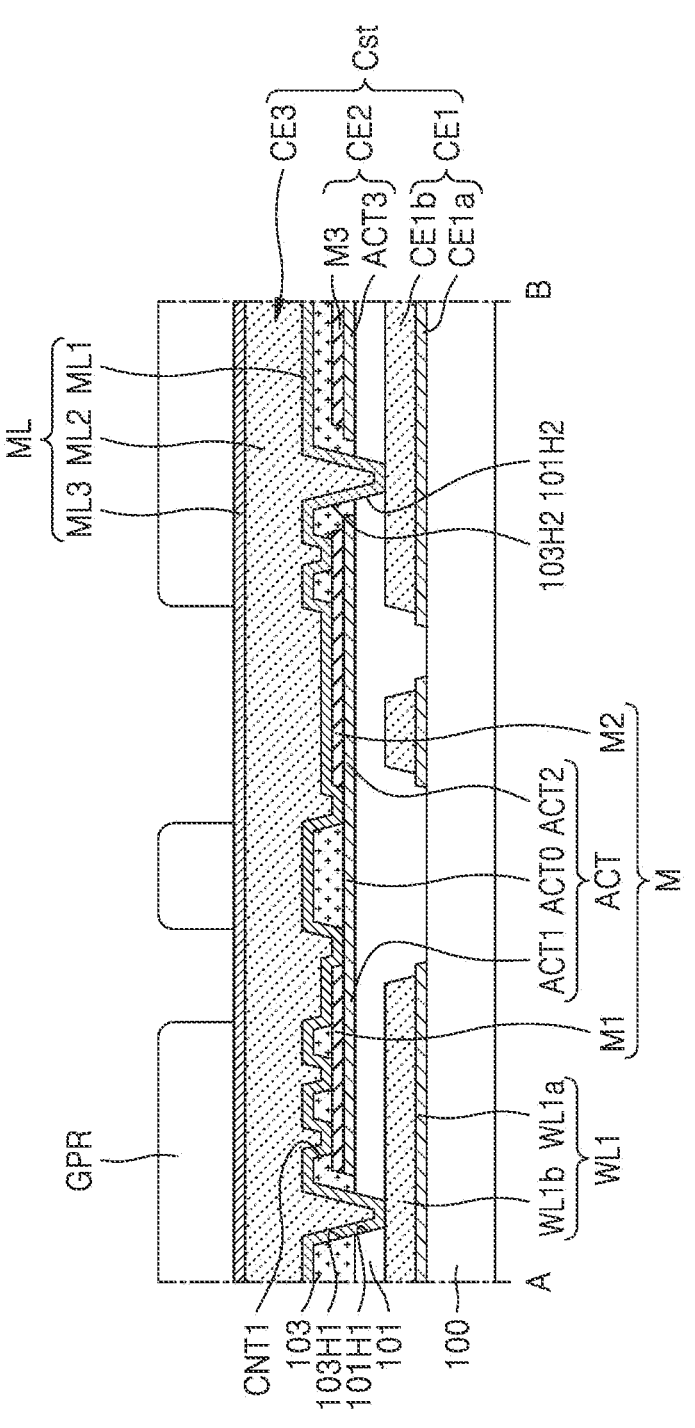
Figure 6N:
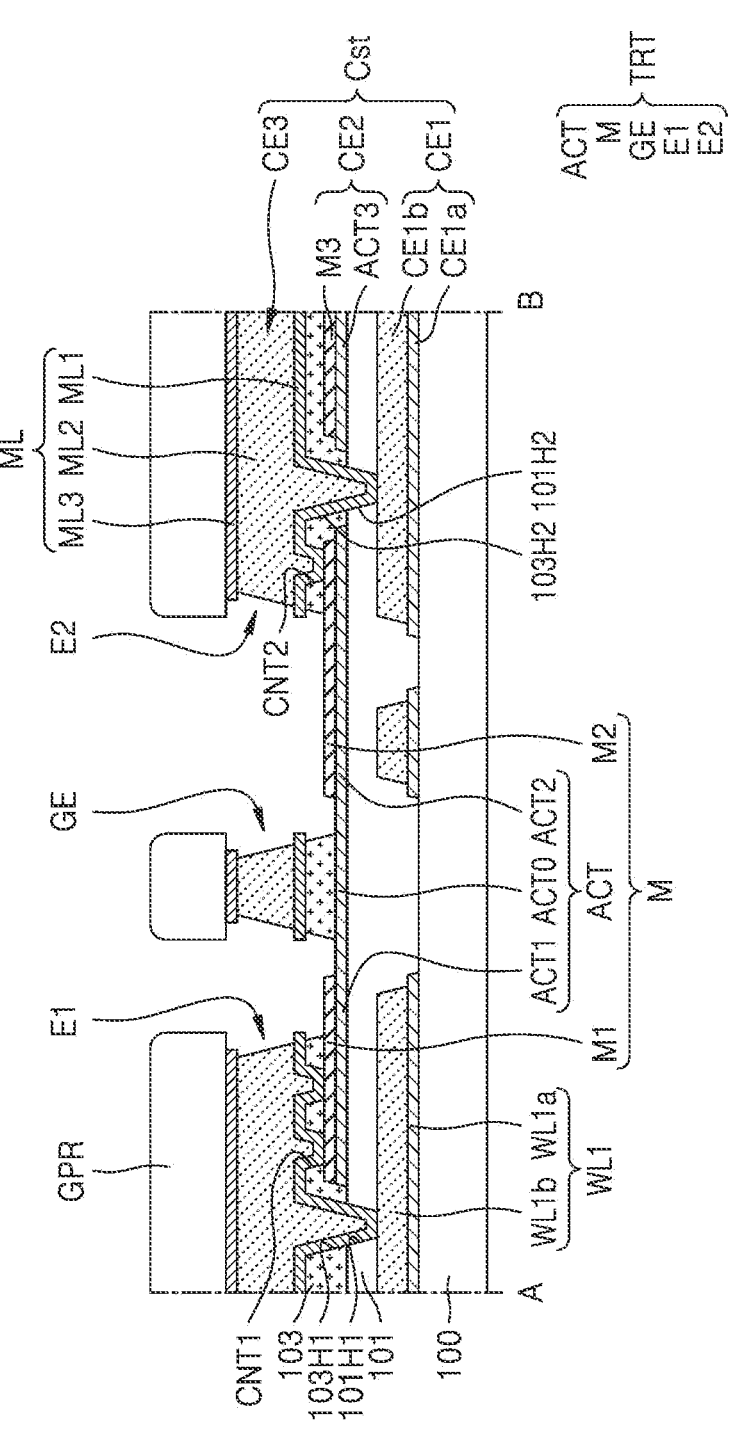
Figure 60:
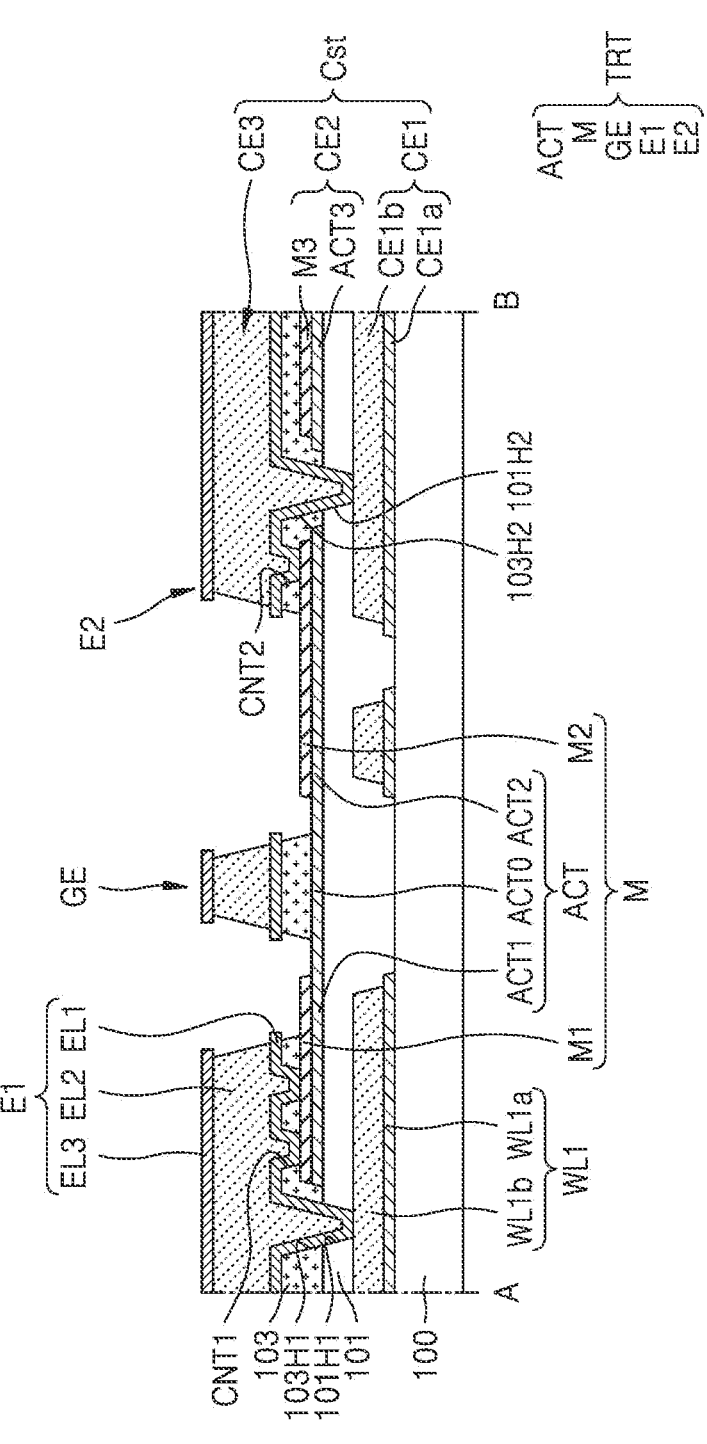
Figure 6P:
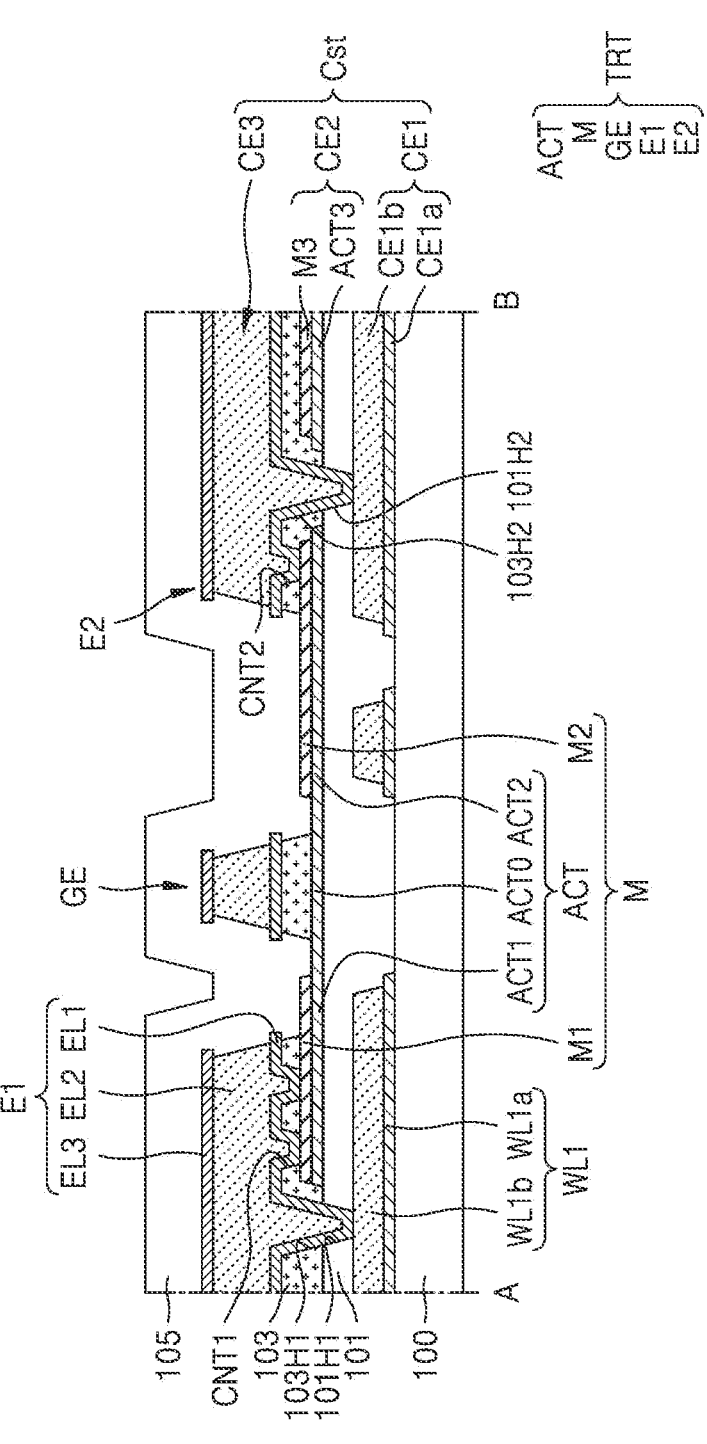
Figure 6S:
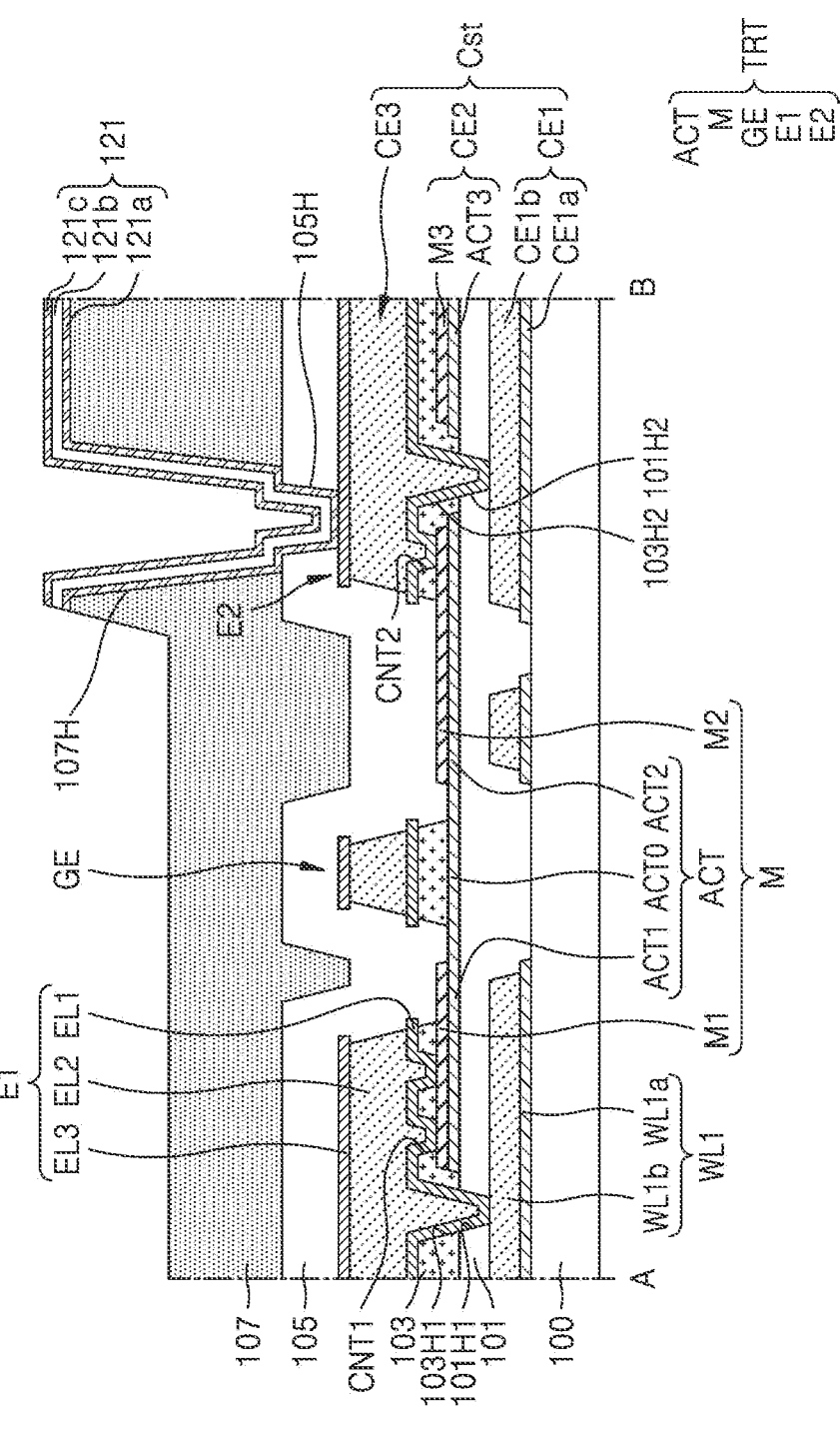
Figure 7A:
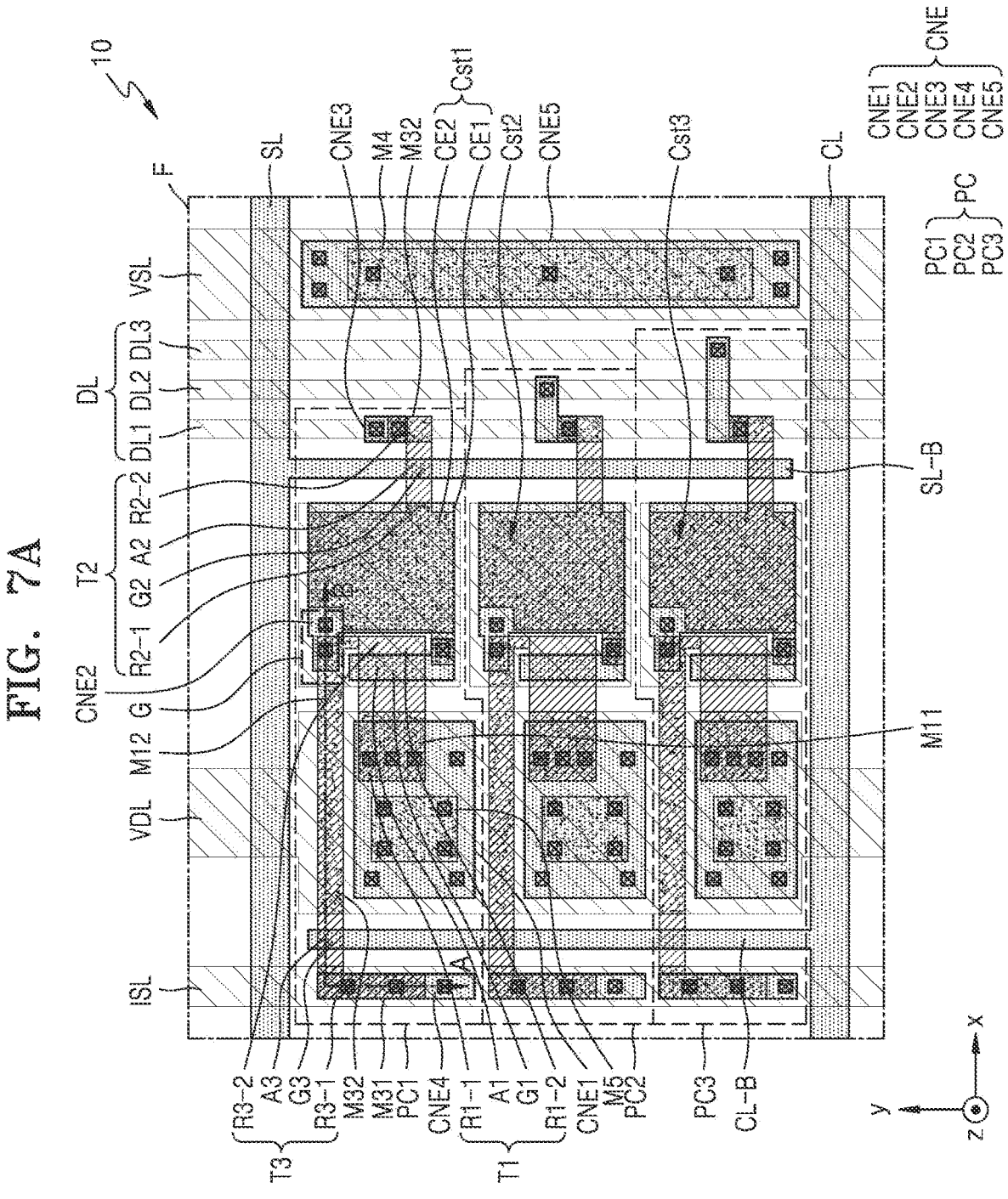
Figure 7B:
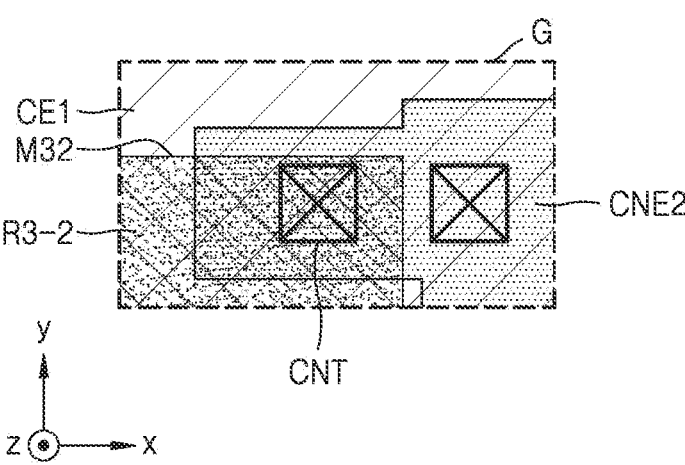
Figure 7C:
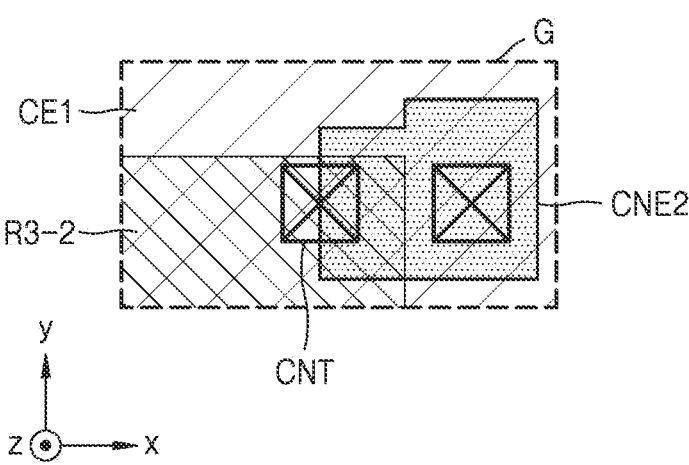

FIG. 4 is an equivalent circuit diagram illustrating a pixel circuit and a display element included in a light-emitting panel according to one or more embodiments;

FIG. 5A includes a cross-sectional view illustrating the light-emitting panel of FIG. 3 taken along the line B-B' of FIG. 3 according to one or more embodiments;

FIG. 5B is an enlarged view illustrating a portion E of the light-emitting panel of FIG. 5A;

FIGS. 5C and 5D are enlarged views illustrating the portion E of the light-emitting panel of FIG. 5A according to one or more embodiments;

Figure 6Q:
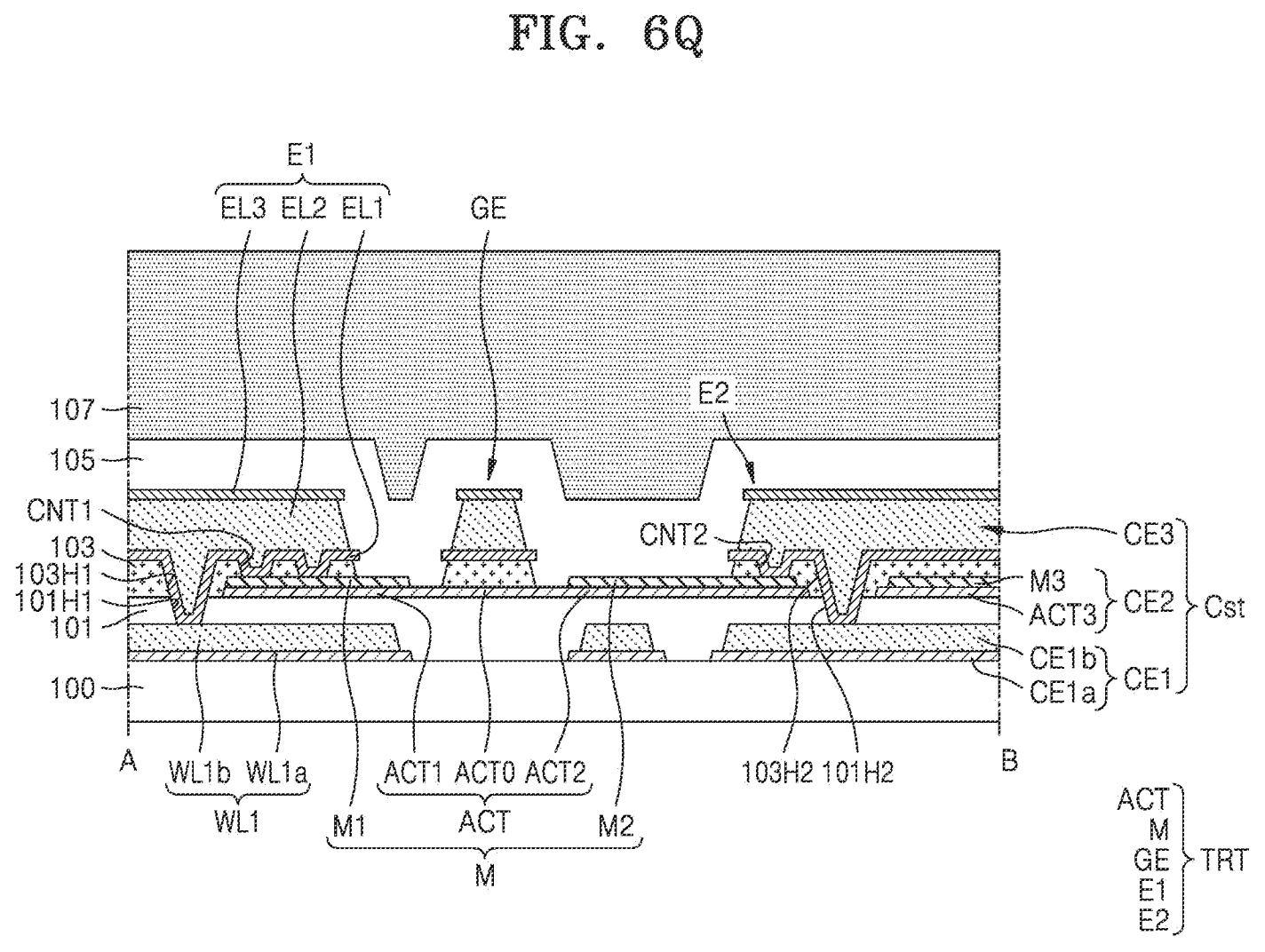
Figure 6R:
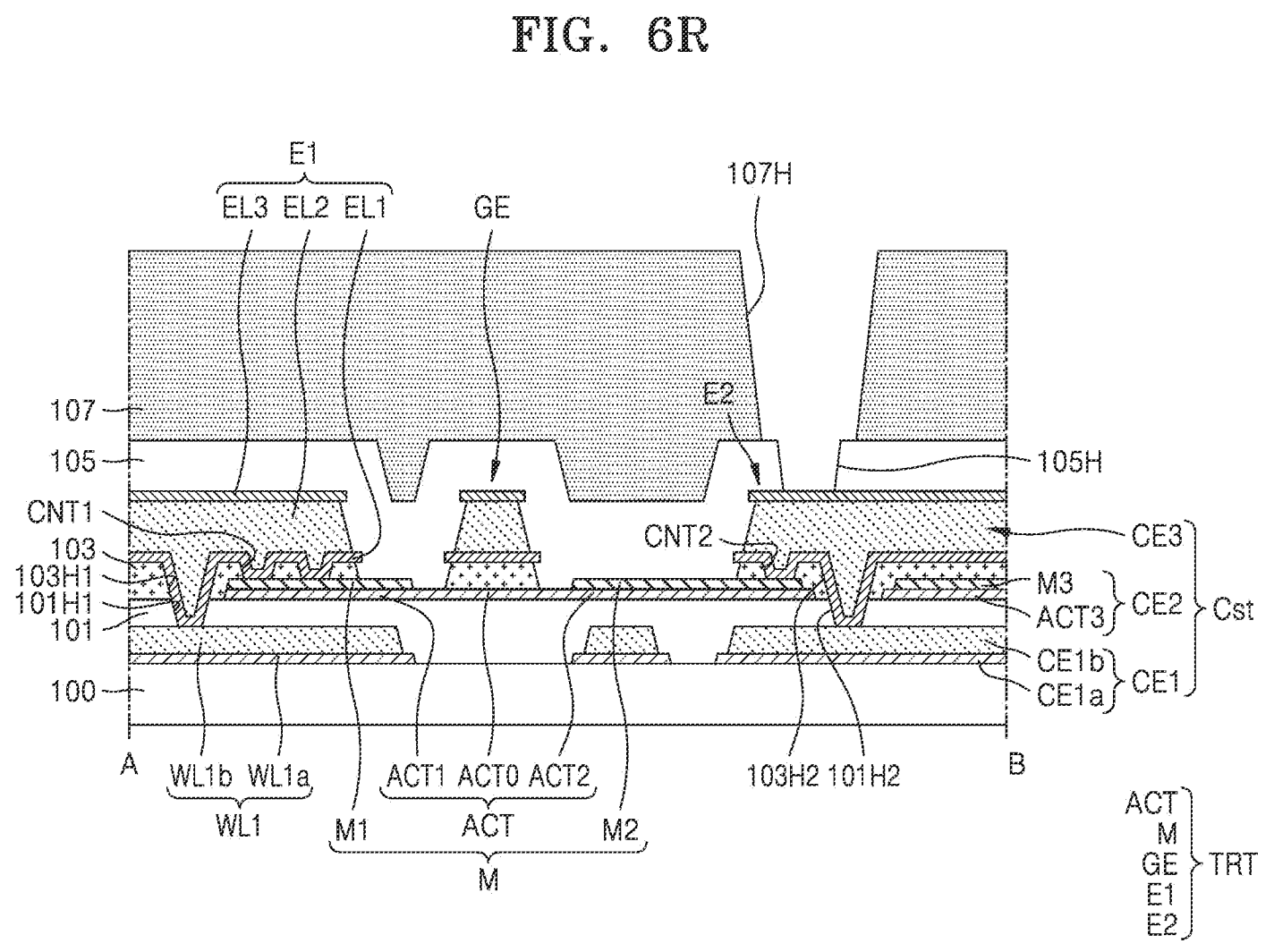

FIGS. 6A through 6S are cross-sectional views illustrating a method of manufacturing a display apparatus according to one or more embodiments;

FIG. 7A is an enlarged view illustrating a portion F of the light-emitting panel of FIG. 3 according to one or more embodiments;

FIG. 7B is an enlarged view illustrating a portion G of FIG. 7A according to one or more embodiments; and FIG. 7C is an enlarged view illustrating the portion G of FIG. 7A, according to a comparative example.

DETAILED DESCRIPTION

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in more detail with reference to the drawings. However, the disclosure is not limited to the following embodiments and may be embodied in various forms.

Hereinafter, embodiments will be described in more detail with reference to the accompanying drawings, wherein the same or corresponding elements are denoted by the same reference numerals throughout and a duplicative description thereof may not be provided.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

Further, the use of "may" when describing embodiments of the present disclosure refers to "one or more embodiments of the present disclosure."

It will be understood that the terms "including," "having," and "comprising" are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly Sizes of elements in the drawings may be exaggerated or contracted for convenience of explanation. For example, because sizes and thicknesses of elements in the drawings are arbitrarily illustrated for convenience of explanation, the disclosure is not limited thereto.

In the following embodiments, the X-axis, the Y-axis and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

When a certain embodiment may be implemented differently, a specific process order may be different from the described order. For example, two consecutively described processes may be performed substantially at the same time or may be performed in an order opposite to the described order.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
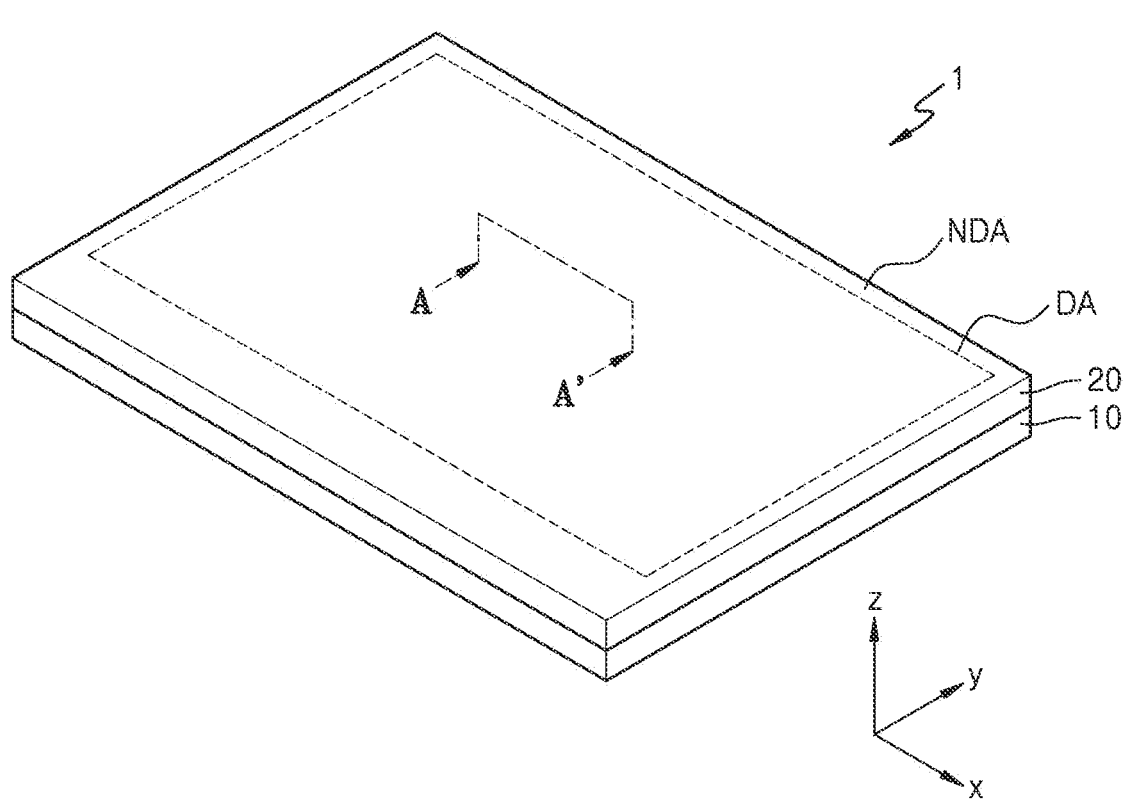
FIG. 1 is a perspective view illustrating a display apparatus according to one or more embodiments.
Figure 2A:
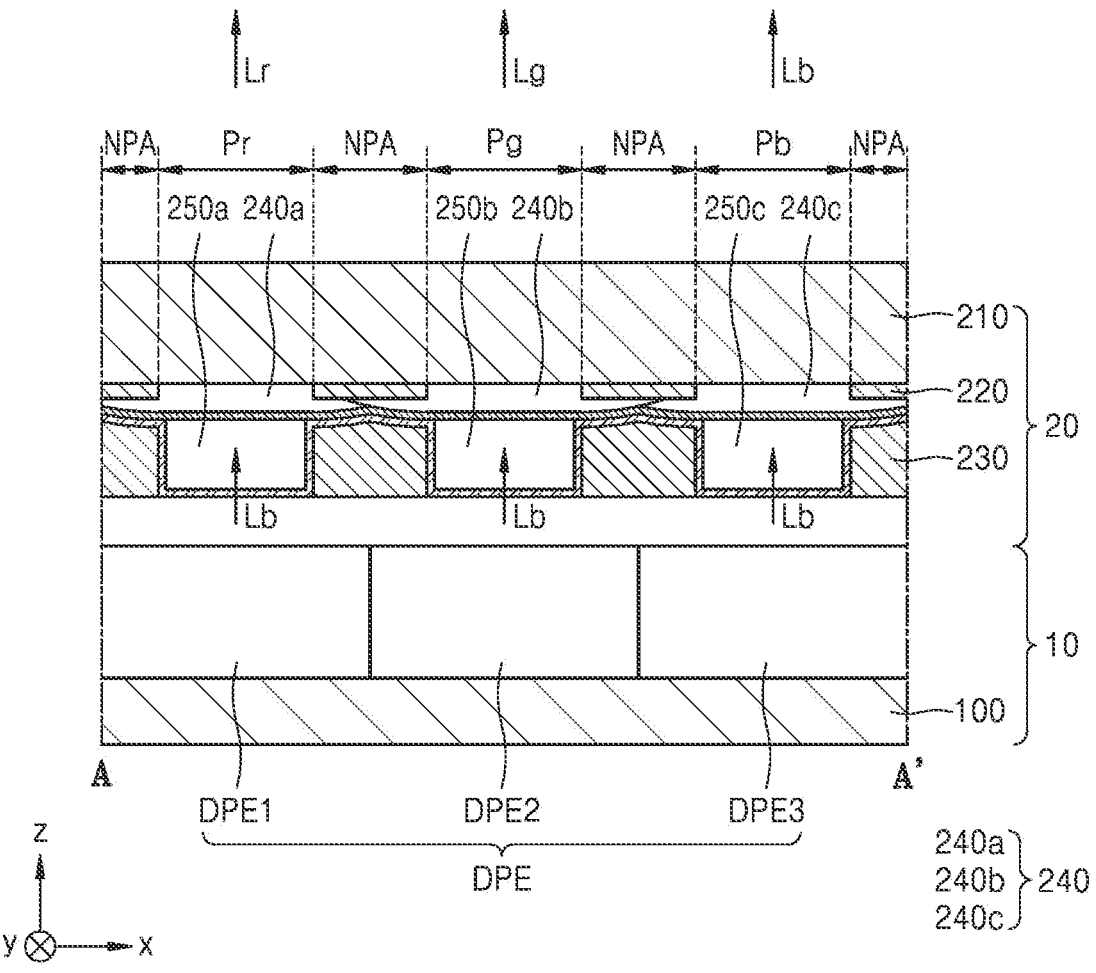
FIG. 2A is a cross-sectional view illustrating the display apparatus of FIG. 1 taken along the line A-A' of FIG. 1.
Figure 2B:
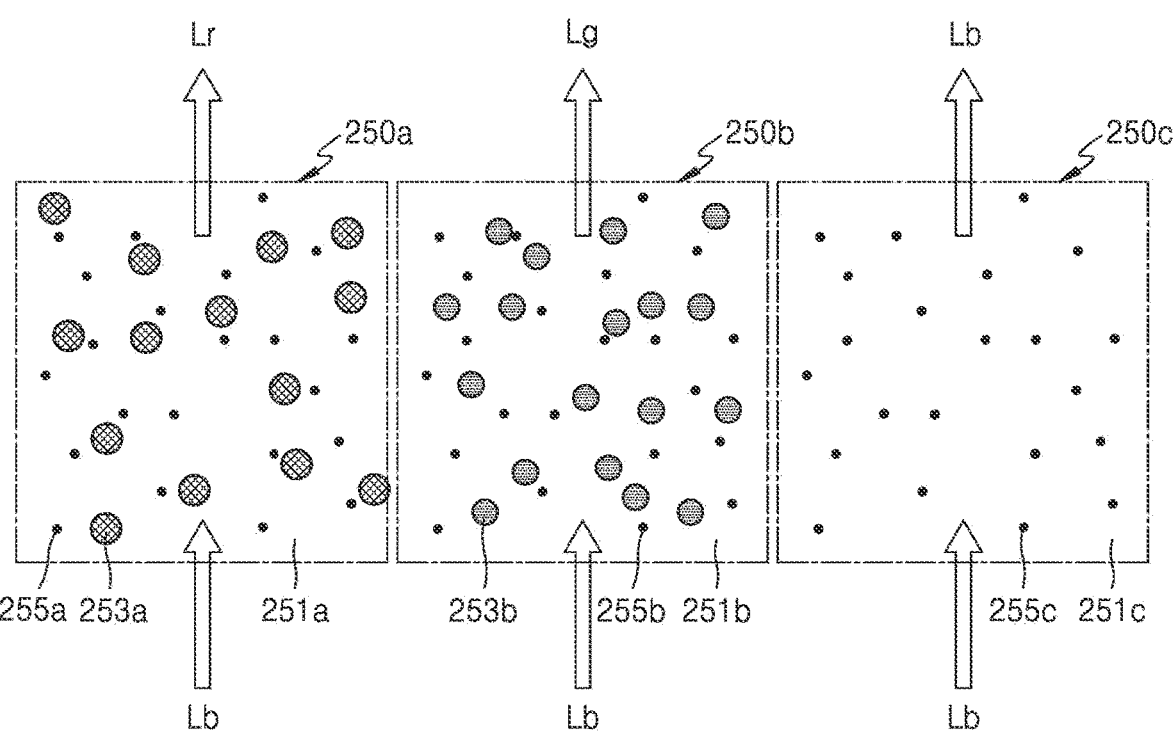
FIG. 2B is a view illustrating a first color conversion layer, a second color conversion layer, and a transmission layer of FIG. 2A.

FIG. 1 is a perspective view illustrating a display apparatus 1 according to one or more embodiments. FIG. 2A is a cross-sectional view illustrating the display apparatus 1 taken along the line A-A' of FIG. 1. FIG. 2B is a view illustrating a first color conversion layer, a second color conversion layer, and a transmission layer of FIG. 2A.

Referring to FIG. 1, the display apparatus 1 may display an image. The display apparatus 1 may include a display area DA and a non-display area NDA. The display apparatus 1 may provide an image through a plurality of sub-pixels located in the display area DA. Each of the sub-pixels of the display apparatus 1 may be an area where light of a certain color may be emitted, and the display apparatus 1 may display an image by using light emitted by the plurality of sub-pixels. For example, the sub-pixel may emit red light, green light, or blue light. In one or more embodiments, the sub-pixel may emit red light, green light, blue light, or white light. However, the present disclosure is not limited thereto.

The non-display area NDA may be around (e.g., may at least partially surround) the display area DA. In one or more embodiments, the non-display area NDA may entirely surround the display area DA. The non-display area NDA may be an area where an image is not provided.

The display area DA may have a polygonal shape including a quadrangular shape as shown in FIG. 1. For example, the display area DA may have a rectangular shape in which a horizontal length is greater than a vertical length, a rectangular shape in which a horizontal length is less than a vertical length, or a square shape. In one or more embodiments, the display area DA may have various suitable shapes such as an elliptical shape or a circular shape. In one or more embodiments, the display apparatus 1 may include a light-emitting panel 10 and a color panel 20 that are stacked in a thickness direction (e.g., a z direction) of the display apparatus 1.

Referring to FIGS. 2A and 2B, the light-emitting panel 10 may include a display element DPE located on a substrate 100. In one or more embodiments, the display element DPE may include a first display element DPE1, a second display element DPE2, and a third display element DPE3. Although not shown in FIG. 2A, each of the first display element DPE1, the second display element DPE2, and the third display element DPE3 may be connected (e.g., electrically connected) to a pixel circuit and driven by the pixel circuit.

Each of the first display element DPE1, the second display element DPE2, and the third display element DPE3 may emit light. In one or more embodiments, the first display element DPE1, the second display element DPE2, and the third display element DPE3 may emit the same light. For example, the first display element DPE1, the second display element DPE2, and the third display element DPE3 may emit any one of red light Lr, green light Lg, and blue light Lb. In another example, the first display element DPE1, the second display element DPE2, and the third display element DPE3 may emit any one of the red light Lr, the green light Lg, the blue light Lb, and white light. In one or more embodiments, one of the first display element DPE1, the second display element DPE2, and the third display element DPE3 and another of the first display element DPE1, the second display element DPE2, and the third display element DPE3 may emit different light. For example, the first display element DPE1 may emit red light Lr, the second display element DPE2 may emit green light Lg, and the third display element DPE3 may emit blue light Lb. In another example, the first display element DPE1 may emit the red light Lr, the second display element DPE2 may emit the green light Lg, the third display element DPE3 may emit the blue light Lb, and a fourth display element may emit white light. For convenience of explanation, the following description will assume that all of the first display element DPE1, the second display element DPE2, and the third display element DPE3 emit the blue light Lb.

The color panel 20 may be located on the light-emitting panel 10. The color panel 20 may change a wavelength of light emitted from the light-emitting panel 10. In one or more embodiments, the color panel 20 may be located on the display element DPE. The color panel 20 may change a wavelength of light emitted from the display element DPE. In one or more embodiments, the blue light Lb emitted from the first display element DPE1, the second display element DPE2, and the third display element DPE3 may be converted into the red light Lr, the green light Lg, and the blue light Lb, or may be transmitted while passing through the color panel 20. For example, blue light Lb emitted from the first display element DPE1 may be converted into red light Lr, blue light Lb emitted from the second display element DPE2 may be converted into green light Lg, and blue light Lb emitted from the third display element DPE3 may be transmitted without being converted while passing through the color panel 20. A region from which the red light Lr is emitted may correspond to a red sub-pixel Pr. A region from which the green light Lg is emitted may correspond to a green sub-pixel Pg. A region through which the blue light Lb is transmitted may correspond to a blue sub-pixel Pb.

The color panel 20 may include an upper substrate 210, a first light-blocking layer 220, a second light-blocking layer 230, a color filter 240, a first color converter 250a, a second color converter 250b, and a transmission part 250c. The first light-blocking layer 220 may have a plurality of holes formed while portions corresponding to the red sub-pixel Pr, the green sub-pixel Pg, and the blue sub-pixel Pb are removed. The first light-blocking layer 220 may include a material portion overlapping (e.g., overlapping in the thickness direction) a non-pixel area NPA, and the material portion may include one or more suitable materials that may absorb light.

The second light-blocking layer 230 may be located on the first light-blocking layer 220. The second light-blocking layer 230 may include a material portion overlapping the non-pixel area NPA, and the material portion may include one or more suitable materials that may absorb light. The second light-blocking layer 230 may include a material that is the same as or different from that of the first light-blocking layer 220. In one or more embodiments, the first light-blocking layer 220 and/or the second light-blocking layer 230 may include an opaque inorganic insulating material such as chrome oxide or molybdenum oxide or an opaque organic insulating material such as a black resin.

The color filter 240 may include a first color filter 240a, a second color filter 240b, and a third color filter 240c. The first color filter 240a may include a pigment or a dye of a first color (e.g., red). The second color filter 240b may include a pigment or a dye of a second color (e.g., green). The third color filter 240c may include a pigment or a dye of a third color (e.g., blue).

The first color converter 250a, the second color converter 250b, and the transmission part 250c may be located between the color filter 240 and the display element DPE.

The first color converter 250a may overlap the first color filter 240a and convert the blue light Lb incident thereon into the red light Lr. The first color converter 250a may include a first photosensitive polymer 251a, first quantum dots 253a, and first scattering particles 255a. The first quantum dots 253a and the first scattering particles 255a may be dispersed in the first photosensitive polymer 251a.

The first quantum dots 253a may be excited by the blue light Lb and may emit the red light Lr having a greater wavelength than that of the blue light Lb. The first photosensitive polymer 251a may be a light-transmitting organic material. The first scattering particles 255a may increase color conversion efficiency by scattering the blue light Lb not absorbed in the first quantum dots 253a and allowing more first quantum dots 253a to be excited. The first scattering particles 255a may be, for example, titanium oxide (TiO2) or metal particles. The first quantum dots 253a may be selected from among a group II-VI compound, a group III-V compound, a group IV-VI compound, a group IV element, a group IV compound, and a combination thereof.

The second color converter 250b may overlap the second color filter 240b and convert the blue light Lb incident thereon into the green light Lg. The second color converter 250b may include a second photosensitive polymer 251b, second quantum dots 253b, and second scattering particles 255b. The second quantum dots 253b and the second scattering particles 255b may be dispersed in the second photosensitive polymer 251b.

The second quantum dots 253b may be excited by the blue light Lb and may emit the green light Lg having a greater wavelength than that of the blue light Lb. The second photosensitive polymer 251b may be a light-transmitting organic material. The second scattering particles 255b may increase color conversion efficiency by scattering the blue light Lb not absorbed in the second quantum dots 253b and allowing more second quantum dots 253b to be excited. The second scattering particles 255b may be, for example, titanium oxide (TiO2) or metal particles. The second quantum dots 253b may be one of a group II-VI compound, a group III-V compound, a group IV-VI compound, a group IV element, a group IV compound, and a combination thereof. The size of the quantum dot may be several nanometers, and a wavelength of light after conversion may vary according to the size of the quantum dot.

The blue light Lb may pass through the transmission part 250c. The transmission part 250c may include a third photosensitive polymer 251c and third scattering particles 255c. The third scattering particles 255c may be dispersed in the third photosensitive polymer 251c. The third photosensitive polymer 251c may include, for example, a light-transmitting organic material such as a silicon resin or epoxy resin, and include the same material as that of the first photosensitive polymer 251a and/or the second photosensitive polymer 251b. The third scattering particles 255c may scatter and emit the blue light Lb, and include the same material as that of the first scattering particles 255a and/or the second scattering particles 255b.

The blue light Lb emitted from the light-emitting panel 10 may be converted in color or transmitted while passing through the first color converter 250a, the second color converter 250b, and the transmission part 250c, and then, may have improved color purity while passing through the color filter 240. For example, the blue light Lb emitted from the first display element DPE1 may be converted and filtered into the red light Lr while passing through the first color converter 250a and the first color filter 240a. The blue light Lb emitted from the second display element DPE2 may be converted and filtered into the green light Lg while passing through the second color converter 250b and the second color filter 240b. The blue light Lb emitted from the third display element DPE3 may be transmitted and filtered while passing through the transmission part 250c and the third color filter 240c.

The display apparatus 1 having the above structure may be included in mobile phones, televisions, advertisement boards, tablet personal computers, laptop computers, and/or the like.

FIG. 3 is a plan view illustrating the light-emitting panel 10 according to one or more embodiments.

Referring to FIG. 3, the light-emitting panel 10 may include the substrate 100, a scan line SL, a data line DL, a pixel circuit PC, the display element DPE, and a pad PAD. The display area DA and the non-display area NDA may be defined in the light-emitting panel 10. In one or more embodiments, the display area DA and the non-display area NDA may be defined in the substrate 100. In other words, the substrate 100 may include the display area DA and the non-display area NDA. For convenience of explanation, the following description will assume that the substrate 100 includes the display area DA and the non-display area NDA.

The pixel circuit PC and the display element DPE may be located in the display area DA. In one or more embodiments, a plurality of pixel circuits PC and a plurality of display elements DPE may be located in the display area DA. The plurality of display elements DPE may emit light.

The non-display area NDA may be an area which the display element DPE is not located. In one or more embodiments, a driving circuit or a power supply voltage line for applying an electrical signal or power to the pixel circuit PC may be located in the non-display area NDA. The non-display area NDA may be around (e.g., may at least partially surround) the display area DA. In one or more embodiments, the non-display area NDA may entirely surround the display area DA. The non-display area NDA may include an adjacent area AA and a pad area PADA. The adjacent area AA may be adjacent to the display area DA. The pad area PADA may be located outside the adjacent area AA. Although the pad area PADA is located outside the adjacent area AA in a −y direction in FIG. 3, in one or more embodiments, the pad area PADA may be located outside the adjacent area AA in a y direction, the −y direction, an x direction, and/or a −x direction.

The substrate 100 may include glass. In one or more embodiments, the substrate 100 may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In one or more embodiments, the substrate 100 may have a multi-layer structure including a base layer including the above polymer resin and a barrier layer. For convenience of explanation, the following description will assume that the substrate 100 includes glass.

The scan line SL may be connected (e.g., electrically connected) to the pixel circuit PC. In one or more embodiments, the scan line SL may extend in the x direction of FIG. 3. The data line DL may be connected (e.g., electrically connected) to the pixel circuit PC. In one or more embodiments, the data line DL may extend in the y direction of FIG. 3.

The pixel circuit PC may be connected (e.g., electrically connected) to the scan line SL that transmits a scan signal and the data line DL that transmits a data signal. The pixel circuit PC may receive a scan signal and a data signal to drive the display element DPE.

The display element DPE may be located in the display area DA. The display element DPE may be driven by the pixel circuit PC. In one or more embodiments, the display element DPE may be an organic light-emitting diode including an organic emission layer. In one or more embodiments, the display element DPE may be a light-emitting diode (LED) including an inorganic emission layer. A size of the light-emitting diode may be micro scale or nano scale. For example, the light-emitting diode may be a micro light-emitting diode. In one or more embodiments, the light-emitting diode may be a nanorod light-emitting diode. The nanorod light-emitting diode may include gallium nitride (GaN). In one or more embodiments, the display element DPE may be a quantum-dot light-emitting diode including a quantum dot light-emitting layer.

The pad PAD may be located in the pad area PADA. In one or more embodiments, a plurality of pads PAD may be provided. The pad PAD may electrically connect elements of a display apparatus to the light-emitting panel 10. For example, the light-emitting panel 10 may be connected (e.g., electrically connected) to a driving chip and/or a printed circuit board through the pad PAD. The driving chip may include an integrated circuit (IC). The printed circuit board may be a flexible printed circuit board (FPCB) or a rigid printed circuit board (PCB) that is hard and thus is not easily bent. In one or more embodiments, the printed circuit board may be a composite printed circuit board including both a rigid PCB and an FPCB. In one or more embodiments, a chip including an IC may be located on the PCB.

FIG. 4 is an equivalent circuit diagram illustrating the pixel circuit PC and the display element DPE included in the light-emitting panel according to one or more embodiments.

Referring to FIG. 4, the display element DPE may be connected (e.g., electrically connected) to the pixel circuit PC. In one or more embodiments, a pixel electrode of the display element DPE may be connected (e.g., electrically connected) to the pixel circuit PC, and a counter electrode of the display element DPE may be connected (e.g., electrically connected) to a common voltage line VSL providing a common power supply voltage ELVSS. The display element DPE may emit light at a luminance corresponding to the amount of current supplied from the pixel circuit PC.

The pixel circuit PC may control the amount of current flowing from a driving voltage line VDL to the common voltage line VSL through the display element DPE according to a data signal. The pixel circuit PC may include a first transistor T1, a second transistor T2, a third transistor T3, and a storage capacitor Cst.

Each of the first transistor T1, the second transistor T2, and the third transistor T3 may be an oxide semiconductor thin-film transistor including a semiconductor layer formed of an oxide semiconductor, or a silicon semiconductor thin-film transistor including a semiconductor layer formed of polycrystalline silicon. According to a type of a transistor, a first electrode may be one of a source electrode and a drain electrode, and a second electrode may be the other of the source electrode and the drain electrode.

The first transistor T1 may be a driving transistor. A first electrode of the first transistor T1 may be connected (e.g., electrically connected) to the driving voltage line VDL that supplies a driving power supply voltage ELVDD, and a second electrode of the first transistor T1 may be connected (e.g., electrically connected) to the pixel electrode of the display element DPE. A gate electrode of the first transistor T1 may be connected (e.g., electrically connected) to a first node N1. The first transistor T1 may control the amount of current flowing from the driving voltage line VDL to the display element DPE according to a voltage of the first node N1.

The second transistor T2 may be a switching transistor. A first electrode of the second transistor T2 may be connected (e.g., electrically connected) to the data line DL, and a second electrode of the second transistor T2 may be connected (e.g., electrically connected) to the first node N1. A gate electrode of the second transistor T2 may be connected (e.g., electrically connected) to the scan line SL. When a scan signal is applied to the scan line SL, the second transistor T2 may be turned on to connect (e.g., electrically connect) the data line DL to the first node N1.

The third transistor T3 may be an initialization transistor and/or a sensing transistor. A first electrode of the third transistor T3 may be connected (e.g., electrically connected) to a second node N2, and a second electrode of the third transistor T3 may be connected (e.g., electrically connected) to an initialization-sensing line ISL. A gate electrode of the third transistor T3 may be connected (e.g., electrically connected) to a control line CL.

When a control signal is applied to the control line CL, the third transistor T3 may be turned on to connect (e.g., electrically connect) the initialization-sensing line ISL to the second node N2. In one or more embodiments, the third transistor T3 may be turned on according to a signal received through the control line CL, and may initialize the pixel electrode of the display element DPE by using an initialization voltage from the initialization-sensing line ISL. In one or more embodiments, when a control signal is applied to the control line CL, the third transistor T3 may be turned on to generate characteristic information of the display element DPE. The third transistor T3 may have both a function of the initialization transistor and a function of the sensing transistor, or have one of the functions. In one or more embodiments, in the case where the third transistor T3 has a function as the initialization transistor, the initialization-sensing line ISL may be referred to as an initialization voltage line. In the case where the third transistor T3 has a function as the sensing transistor, the initialization-sensing line ISL may be referred to as a sensing line. An initialization operation and a sensing operation of the third transistor T3 may be performed individually or concurrently (e.g., simultaneously). Hereinafter, for convenience of explanation, the following description will assume that the third transistor T3 has both the function of the initialization transistor and the function of the sensing transistor.

The storage capacitor Cst may be connected between the first node N1 and the second node N2. For example, a first capacitor electrode of the storage capacitor Cst may be connected (e.g., electrically connected) to the pixel electrode of the display element DPE, and a second capacitor electrode of the storage capacitor Cst may be connected (e.g., electrically connected) to the gate electrode of the first transistor T1.

Although the first transistor T1, the second transistor T2, and the third transistor T3 are n-channel metal-oxide-semiconductor (NMOS) transistors in FIG. 4, in one or more embodiments, at least one of the first transistor T1, the second transistor T2, or the third transistor T3 may be provided as a p-channel metal-oxide-semiconductor (PMOS) transistor.

Although three transistors are illustrated in FIG. 4, in one or more embodiments, the pixel circuit PC may include four or more transistors.

FIG. 5A includes a cross-sectional view illustrating the light-emitting panel 10 taken along the line B-B' of FIG. 3 according to one or more embodiments. FIG. 5B is an enlarged view illustrating a portion E of the light-emitting panel 10 of FIG. 5A.

Referring to FIGS. 5A and 5B, the light-emitting panel 10 may include the substrate 100, a pixel circuit layer, a display element layer, and an encapsulation layer 130. In one or more embodiments, the substrate 100 may include glass.

The pixel circuit layer may be located on the substrate 100. The pixel circuit layer may include a wiring, a transistor TRT, the storage capacitor Cst, a buffer layer 101, a first inorganic insulating layer 103, a second inorganic insulating layer 105, and an organic insulating layer 107. The transistor TRT may include a semiconductor layer ACT, a metal layer M, a gate electrode GE, a first electrode E1, and a second electrode E2. In one or more embodiments, the storage capacitor Cst may include a first capacitor electrode CE1, a second capacitor electrode CE2, and a third capacitor electrode CE3. The first capacitor electrode CE1, the second capacitor electrode CE2, and the third capacitor electrode CE3 may overlap one another. In this case, the second electrode E2 may extend to the third capacitor electrode CE3. For example, the second electrode E2 and the third capacitor electrode CE3 may be integrally formed with each other.

The wiring may be located on the substrate 100. The wiring may be a signal line and/or a power supply voltage line. For example, the wiring may be a data line, a driving voltage line, a common voltage line, and/or an initialization-sensing line. In one or more embodiments, the wiring may include a first wiring WL1 and a second wiring WL2. The first wiring WL1 and the second wiring WL2 may transmit signals and/or a power supply voltage to the transistor TRT.

The first wiring WL1, the second wiring WL2, and the first capacitor electrode CE1 may be located on or at the same layer. In other words, the first wiring WL1, the second wiring WL2, and the first capacitor electrode CE1 may be located between the substrate 100 and the buffer layer 101. The first wiring WL1, the second wiring WL2, and the first capacitor electrode CE1 may include the same material, and may be formed by using the same process. Hereinafter, the first wiring WL1 will be primarily described in more detail.

The first wiring WL1 may include a conductive material including molybdenum (Mo), aluminum (Al), copper (Cu), and/or titanium (Ti) and may have a single-layer structure or a multi-layer structure including the above material. In one or more embodiments, the first wiring WL1 may include a first wiring layer WL1a and a second wiring layer WL1b. The first wiring layer WL1a may include titanium (Ti). The second wiring layer WL1b may be located on the first wiring layer WL1a. The second wiring layer WL1b may include a material having high conductivity. For example, the second wiring layer WL1b may include copper (Cu). In one or more embodiments, the first wiring layer WL1a of the first wiring WL1 may not be provided. In one or more embodiments, the first wiring WL1 may further include a third wiring layer.

In one or more embodiments, the first capacitor electrode CE1 may include a first layer CE1a of the first capacitor electrode CE1 and a second layer CE1b of the first capacitor electrode CE1. In one or more embodiments, the first layer CE1a of the first capacitor electrode CE1 and the first wiring layer WL1a may include the same material. The second layer CE1b of the first capacitor electrode CE1 and the second wiring layer WL1b may include the same material.

The buffer layer 101 may be located on the wiring. In one or more embodiments, the buffer layer 101 may be located on the first wiring WL1, the second wiring WL2, and the first capacitor electrode CE1. The buffer layer 101 may have a hole. In one or more embodiments, the buffer layer 101 may include a first buffer layer hole 101H1 and a second buffer layer hole 101H2. The first buffer layer hole 101H1 may overlap the first wiring WL1 and may expose the first wiring WL1. The second buffer layer hole 101H2 may overlap the first capacitor electrode CE1 and may expose the first capacitor electrode CE1.

The buffer layer 101 may include an inorganic insulating material such as silicon nitride (SiNx), silicon oxynitride (SiON), or silicon oxide (SiO2), and may have a single-layer structure or a multi-layer structure including the inorganic insulating material.

The semiconductor layer ACT may be located on the buffer layer 101. The semiconductor layer ACT may include an oxide semiconductor. For example, the semiconductor layer ACT may include a Zn-oxide-based material such as Zn-oxide, In—Zn oxide, and Ga—In—Zn oxide. In one or more embodiments, the semiconductor layer ACT may include an In—Ga—Zn—O(IGZO), In—Sn—Zn—O (ITZO), or In—Ga—Sn—Zn—O(IGTZO) semiconductor containing a metal such as indium (In), gallium (Ga), or stannum (Sn) in ZnO.

The semiconductor layer ACT of the transistor TRT may include a channel semiconductor layer ACT0, a first semiconductor layer ACT1, and a second semiconductor layer ACT2. The channel semiconductor layer ACT0 may be located between the first semiconductor layer ACT1 and the second semiconductor layer ACT2. The first semiconductor layer ACT1 and the second semiconductor layer ACT2 may extend from the channel semiconductor layer ACT0 to edges of the semiconductor layer ACT. The first semiconductor layer ACT1 and the second semiconductor layer ACT2 may be respectively connected to the first electrode E1 and the second electrode E2 through the metal layer M described below.

The first semiconductor layer ACT1 may extend in a first direction (e.g., –x direction of FIG. 5A) from the channel semiconductor layer ACT0, specifically, toward the first electrode E1. The second semiconductor layer ACT2 may extend in a second direction (e.g., x direction of FIG. 5A) opposite the first direction from the channel semiconductor layer ACT0, specifically, toward the second electrode E2. For example, the first semiconductor layer ACT1 and the second semiconductor layer ACT2 may extend in different direction from the channel semiconductor layer ACT0. Also, each of the first semiconductor layer ACT1 and the second semiconductor layer ACT2 is not limited to extending in one direction, and may extend in multiple directions (e.g., extend to be bent at 90°) or extend in a curved shape.

The metal layer M, specifically, a first metal layer M1, may be located on the first semiconductor layer ACT1, and a second metal layer M2 may be located on the second semiconductor layer ACT2. No metal layer may be located on the channel semiconductor layer ACT0. Hereinafter, the first semiconductor layer ACT1 will be primarily described.

In one or more embodiments, the first metal layer M1 may be located within an outer circumference of the first semiconductor layer ACT1. For example, the first metal layer M1 may be located within the first semiconductor layer ACT1 when viewed in a direction (e.g., –z direction) perpendicular to a surface of the first semiconductor layer ACT1. In one or more embodiments, the metal layer M1 may overlap the first semiconductor layer ACT1 in a plan view.

In one or more embodiments, a portion of the first semiconductor layer ACT1 where the first metal layer M1 is located may be a non-conductive portion.

Accordingly, the first semiconductor layer ACT1 and the first metal layer M1 contacting the first semiconductor layer ACT1 may be particularly conductive through the first metal layer M1. Because a metal layer has very low resistance and, in particular, has lower resistance than that of a semiconductor layer, conductivity may be improved. Also, a portion of the first semiconductor layer ACT1 where the first metal layer M1 is located may be conductive through the first metal layer M1 even when the first semiconductor layer ACT1 is not doped.

The second capacitor electrode CE2 may include a third semiconductor layer ACT3 located on the buffer layer 101. In this case, the third semiconductor layer ACT3 of the second capacitor electrode CE2 and the semiconductor layer ACT may include the same material and may be formed by using the same process.

The second capacitor electrode CE2 may include a third metal layer M3 located on the third semiconductor layer ACT3. In one or more embodiments, the third metal layer M3 may be located within an outer circumference of the third semiconductor layer ACT3. For example, the third metal layer M3 may be located within the third semiconductor layer ACT3 when viewed in a direction (e.g., –z direction) perpendicular to a surface of the third semiconductor layer ACT3. In one or more embodiments, the third metal layer M3 may overlap the third semiconductor layer ACT3 in a plan view.

In one or more embodiments, a portion of the third semiconductor layer ACT3 where the third metal layer M3 is located may be a non-conductive portion.

The second capacitor electrode CE2 may function as an electrode plate of the storage capacitor Cst through the third metal layer M3.

The first inorganic insulating layer 103 may cover the semiconductor layer ACT, the metal layer M, and the second capacitor electrode CE2. The first inorganic insulating layer 103 may have a plurality of holes. In one or more embodiments, the first inorganic insulating layer 103 may include a first contact hole CNT1, a second contact hole CNT2, a first hole 103H1, and a second hole 103H2. The first contact hole CNT1 may overlap the first semiconductor layer ACT1 and the first metal layer M1 and may expose the first metal layer M1 on the first semiconductor layer ACT1. The second contact hole CNT2 may overlap the second semiconductor layer ACT2 and the second metal layer M2 and may expose the second metal layer M2 on the second semiconductor layer ACT2. The first hole 103H1 may overlap and be connected to the first buffer layer hole 101H1. The second hole 103H2 may overlap and be connected to the second buffer layer hole 101H2.

The first electrode E1 and the second electrode E2 may be located on the first inorganic insulating layer 103. The second electrode E2 may be integrally formed with the third capacitor electrode CE3 as described below. The first electrode E1 may overlap the first semiconductor layer ACT1 and the first metal layer M1 and may be connected (e.g., electrically connected) to the first metal layer M1 and the first semiconductor layer ACT1 through the first contact hole CNT1. The second electrode E2 may overlap the second semiconductor layer ACT2 and the second metal layer M2 and may be connected (e.g., electrically connected) to the second metal layer M2 and the second semiconductor layer ACT2 through the second contact hole CNT2. In one or more embodiments, the first electrode E1 may entirely overlap the first contact hole CNT1 in a plan view. The second electrode E2 may entirely overlap the second contact hole CNT2 in a plan view.

In the present embodiment, as described below, the first metal layer M1 and the second metal layer M2 may be located on the first semiconductor layer ACT1 and the second semiconductor layer ACT2, and then, the first electrode E1 and the second electrode E2 may overlap the first metal layer M1 and the second metal layer M2. For example, the first metal layer M1 may be located on the first semiconductor layer ACT1 and the second metal layer M2 may be located on the second semiconductor layer ACT2. Because the first metal layer M1 and the second metal layer M2 are metals and have conductive functions, the semiconductor layers under the first metal layer M1 and the second metal layer M2 do not have to be doped. Accordingly, the first electrode E1 may entirely overlap the first contact hole CNT1 in a plan view.

The first electrode E1 may be connected (e.g., electrically connected) to the first wiring WL1 through the first buffer layer hole 101H1 and the first hole 103H1. The second electrode E2 may be connected (e.g., electrically connected) to the first capacitor electrode CE1 through the second buffer layer hole 101H2 and the second hole 103H2. Accordingly, the transistor TRT may receive a signal and/or a power supply voltage from the first wiring WL1, and may be connected to the storage capacitor Cst.

In one or more embodiments, the second electrode E2 may be connected (e.g., electrically connected) to another wiring, for example, the second wiring WL2, through the second buffer layer hole 101H2 and the second hole 103H2. For convenience of explanation, as shown in FIG. 5A, the following description will assume that the second electrode E2 is connected (e.g., electrically connected) to the first capacitor electrode CE1.

The third capacitor electrode CE3 may overlap the second capacitor electrode CE2, and the third capacitor electrode CE3 may be integrally formed with the second electrode E2.

The gate electrode GE may overlap the channel semiconductor layer ACT0. In one or more embodiments, the gate electrode GE may be spaced from each of the first electrode E1 and the second electrode E2. In one or more embodiments, the gate electrode GE may be located between the first electrode E1 and the second electrode E2.

The first electrode E1, the second electrode E2 (or the third capacitor electrode CE3), and the gate electrode GE may be located on or at the same layer. In other words, the first electrode E1, the second electrode E2, and the gate electrode GE may be located between the first inorganic insulating layer 103 and the second inorganic insulating layer 105. The first electrode E1, the second electrode E2, and the gate electrode GE may include the same material and may be formed by using the same process. Hereinafter, the first electrode E1 will be primarily described in more detail.

The first electrode E1 may include a conductive material including molybdenum (Mo), aluminum (Al), copper (Cu), and/or titanium (Ti), and may have a single-layer structure or a multi-layer structure including the above material. In one or more embodiments, the first electrode E1 may include a transparent conductive material. For example, the first electrode E1 may include a conductive oxide such as indium tin oxide (ITO), indium zinc oxide (IZO), zinc oxide (ZnO), indium oxide (In2O3), indium gallium oxide (IGO), or aluminum zinc oxide (AZO). In one or more embodiments, the first electrode E1 may include a first electrode layer EL1, a second electrode layer EL2, and a third electrode layer EL3. The first electrode layer EL1 may include titanium (Ti). The second electrode layer EL2 may be located on the first electrode layer EL1. The second electrode layer EL2 may include copper (Cu). The third electrode layer EL3 may be located on the second electrode layer EL2. The third electrode layer EL3 may include indium tin oxide. In this case, the third electrode layer EL3 may prevent or reduce the second electrode layer EL2 from being damaged during a process of manufacturing a display apparatus. In one or more embodiments, in the case where the second electrode layer EL2 has chemical resistance, the third electrode layer EL3 may not be provided.

The storage capacitor Cst may include the first capacitor electrode CE1, the second capacitor electrode CE2, and the third capacitor electrode CE3. The second capacitor electrode CE2 may include the third semiconductor layer ACT3 located on the buffer layer 101 and the third metal layer M3 on the third semiconductor layer ACT3 as described above. The third semiconductor layer ACT3 and the semiconductor layer ACT may include the same material and may be formed by using the same process. The third metal layer M3 and the metal layer M may include the same material and may be formed by using the same process. Accordingly, because the second capacitor electrode CE2 may function as an electrode plate through the third metal layer M3, the storage capacitor Cst may have increased capacity as at least a dual storage capacitor.

The second inorganic insulating layer 105 may cover the first electrode E1, the second electrode E2, and the gate electrode GE. In one or more embodiments, the second inorganic insulating layer 105 may continuously extend. The second inorganic insulating layer 105 may include a lower hole 105H. The lower hole 105H may overlap the second electrode E2 and may expose the second electrode E2.

The second inorganic insulating layer 105 may include an inorganic insulating material such as silicon oxide (SiO2), silicon nitride (SiNx), silicon oxynitride (SiON), aluminum oxide (Al2O3), titanium oxide (TiO2), tantalum oxide (Ta2O5), hafnium oxide (HfO2), and/or zinc oxide (ZnOx). In one or more embodiments, zinc oxide (ZnOx) may be zinc oxide (ZnO) and/or zinc peroxide (ZnO2).

The organic insulating layer 107 may be located on the second inorganic insulating layer 105. The organic insulating layer 107 may include an organic insulating layer hole 107H overlapping and connected to the lower hole 105H. In one or more embodiments, a top surface of the organic insulating layer 107 may be flat. In one or more embodiments, the organic insulating layer 107 may have a stepped portion. For example, a distance from the substrate 100 to the top surface of the organic insulating layer 107 in a portion where a pixel electrode 121 is located may be greater than a distance from the substrate 100 to the top surface of the organic insulating layer 107 in a portion where the pixel electrode 121 is not located. The organic insulating layer 107 may include an organic material. The organic insulating layer 107 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element layer may be located on the pixel circuit layer. The display element layer may include the display element DPE and a pixel-defining layer 127. The display element DPE may include the pixel electrode 121, an emission layer 123, and a counter electrode 125. In one or more embodiments, the display element DPE may be located on the second inorganic insulating layer 105.

The pixel electrode 121 may be located on the organic insulating layer 107. The pixel electrode 121 may be connected (e.g., electrically connected) to the second electrode E2 through the lower hole 105H and the organic insulating layer hole 107H. In one or more embodiments, the pixel electrode 121 may include a first pixel electrode layer 121a, a second pixel electrode layer 121b, and a third pixel electrode layer 121c. The first pixel electrode layer 121a may include a conductive oxide such as indium tin oxide (ITO), indium zinc oxide (IZO), zinc oxide (ZnO), indium oxide (In2O3), indium gallium oxide (IGO), or aluminum zinc oxide (AZO). The second pixel electrode layer 121b may include a reflective layer including silver (Ag), magnesium (Mg), aluminum (Al), platinum (Pt), palladium (Pd), gold (Au), nickel (Ni), neodymium (Nd), iridium (Ir), chrome (Cr), and/or a compound thereof. The third pixel electrode layer 121c may include a conductive oxide such as indium tin oxide (ITO), indium zinc oxide (IZO), zinc oxide (ZnO), indium oxide (In2O3), indium gallium oxide (IGO), or aluminum zinc oxide (AZO).

The pixel-defining layer 127 may include a pixel opening 127OP overlapping the pixel electrode 121 and may cover an edge of the pixel electrode 121. In one or more embodiments, the pixel opening 127OP may define an emission area of light emitted from the display element DPE. For example, a width of the pixel opening 127OP may correspond to a width of the emission area. In one or more embodiments, a width of the pixel opening 127OP may correspond to a width of a sub-pixel.

In one or more embodiments, the pixel-defining layer 127 may include an organic insulating material. In one or more embodiments, the pixel-defining layer 127 may include an inorganic insulating material such as silicon nitride (SiNx), silicon oxynitride (SiON), or silicon oxide (SiO2). In one or more embodiments, the pixel-defining layer 127 may include an organic insulating material and an inorganic insulating material. In one or more embodiments, the pixel-defining layer 127 may include a light-blocking material and may be black. The light-blocking material may include carbon black, carbon nanotubes, a resin or paste including black dye, metal particles, for example, nickel, aluminum, molybdenum, and an alloy thereof, metal oxide particles (e.g., chrome oxide), or metal nitride particles (e.g., chrome nitride). In the case where the pixel-defining layer 127 includes a light-blocking material, external light reflection by metal structures located below the pixel-defining layer 127 may be reduced.

The emission layer 123 may be located in the pixel opening 127OP of the pixel-defining layer 127. The emission layer 123 may include a high-molecular weight organic material or a low-molecular weight organic material emitting light of a certain color. In one or more embodiments, a first functional layer and a second functional layer may be respectively located under and over the emission layer 123. For example, the first functional layer may include a hole transport layer (HTL), or may include an HTL and a hole injection layer (HIL). The second functional layer that is located on the emission layer 123 is optional. The second functional layer may include an electron transport layer (ETL) and/or an electron injection layer (EIL).

The counter electrode 125 may be located on the emission layer 123. In one or more embodiments, the counter electrode 125 may continuously extend in the display area DA. The counter electrode 125 may include a conductive material having a low work function. For example, the counter electrode 125 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. In one or more embodiments, the counter electrode 125 may further include a layer such as ITO, IZO, ZnO, or In2O3 on the (semi) transparent layer including the above material.

The encapsulation layer 130 may be located on the display element layer. The encapsulation layer 130 may include at least one inorganic encapsulation layer and at least one organic encapsulation layer. In one or more embodiments, the encapsulation layer 130 may include a first inorganic encapsulation layer 131, an organic encapsulation layer 133, and a second inorganic encapsulation layer 135 which are sequentially stacked.

The first inorganic encapsulation layer 131 may be located on the counter electrode 125.

The organic encapsulation layer 133 may be located on the first inorganic encapsulation layer 131. In one or more embodiments, a top surface of the organic encapsulation layer 133 may be flat. The organic encapsulation layer 133 may include a polymer-based material. Examples of the polymer-based material may include an acrylic resin, an epoxy resin, polyimide, and polyethylene. In one or more embodiments, the organic encapsulation layer 133 may include acrylate.

The second inorganic encapsulation layer 135 may be located on the organic encapsulation layer 133. Each of the first inorganic encapsulation layer 131 and the second inorganic encapsulation layer 135 may include at least one inorganic material from among aluminum oxide (Al2O3), titanium oxide (TiO2), tantalum oxide (Ta2O5), hafnium oxide (HfO2), zinc oxide (ZnOx), silicon oxide (SiO2), silicon nitride (SiNx), and silicon oxynitride (SiON).

Referring to FIG. 5B, the storage capacitor Cst may include the first capacitor electrode CE1, the second capacitor electrode CE2, and the third capacitor electrode CE3. As described above, the second capacitor electrode CE2 may include the third semiconductor layer ACT3 and the third metal layer M3, and particularly, may function as an electrode plate through the third metal layer M3. Also, the second electrode E3 may be integrally formed with the third capacitor electrode CE3. Accordingly, the storage capacitor Cst may have increased capacitor as at least a dual storage capacitor. Also, as the capacity of the storage capacitor Cst increases, a design margin for additionally forming an opening such as a contact hole in a capacitor electrode may be secured.

FIGS. 5C and 5D are enlarged views illustrating the portion E of the light-emitting panel 10 of FIG. 5A according to one or more embodiments. In FIGS. 5C and 5D, elements located on a fourth capacitor electrode CE4 are omitted. Hereinafter, a difference from the above embodiments will be primarily described.

Referring to FIG. 5C, the storage capacitor Cst may include the first capacitor electrode CE1, the second capacitor electrode CE2, the third capacitor electrode CE3, and fourth capacitor electrode CE4. For example, the storage capacitor Cst may further include the fourth capacitor electrode CE4. The first capacitor electrode CE1 may be located between the substrate 100 and the buffer layer 101. The second capacitor electrode CE2 may be located between the buffer layer 101 and the first inorganic insulating layer 103. The second capacitor electrode CE2 may overlap the first capacitor electrode CE1. The third capacitor electrode CE3 may be located between the first inorganic insulating layer 103 and the second inorganic insulating layer 105. The third capacitor electrode CE3 may overlap the second capacitor electrode CE2.

The fourth capacitor electrode CE4 may be located on the organic insulating layer 107. The fourth capacitor electrode CE4 may overlap the third capacitor electrode CE3. In one or more embodiments, the fourth capacitor electrode CE4 may be a part of the pixel electrode 121.

Accordingly, the storage capacitor Cst may secure capacity as a triple storage capacitor between the first capacitor electrode CE1 through the fourth capacitor electrode CE4. Also, as the capacity of the storage capacitor Cst increases, a design margin for additionally forming an opening such as a contact hole in a capacitor electrode may be secured.

Referring to FIG. 5D, the storage capacitor Cst may include the first capacitor electrode CE1, the second capacitor electrode CE2, the third capacitor electrode CE3, and the fourth capacitor electrode CE4. In this case, the fourth capacitor electrode CE4 may be located on the organic insulating layer 107. The organic insulating layer 107 may include a connection hole with the second inorganic insulating layer 105, and may expose the second inorganic insulating layer 105. The fourth capacitor electrode CE4 may contact the second inorganic insulating layer 105 through the connection hole. For example, a part of the fourth capacitor electrode CE4 may be located on the organic insulating layer 107, and another part of the fourth capacitor electrode CE4 may be located on the second inorganic insulating layer 105. Also, the fourth capacitor electrode CE4 may overlap the third capacitor electrode CE3.

Accordingly, the storage capacitor Cst may secure capacity as a triple storage capacitor between the first capacitor electrode CE1 through the fourth capacitor electrode CE4. Also, as the capacity of the storage capacitor Cst increases, a design margin for additionally forming an opening such as a contact hole in a capacitor electrode may be secured.

FIGS. 6A through 6S are cross-sectional views illustrating a method of manufacturing a display apparatus according to one or more embodiments. In FIGS. 6A through 6S, the same elements as those in FIG. 5A are denoted by the same reference numerals, and thus a repeated description thereof will not be provided.

Referring to FIG. 6A, the first wiring WL1, the second wiring WL2, and the first capacitor electrode CE1 may be formed on the substrate 100. The first wiring WL1, the second wiring WL2, and the first capacitor electrode CE1 may be formed by using the same process. The first wiring WL1, the second wiring WL2, and the first capacitor electrode CE1 may include the same material. In the present embodiment, because most wirings are located on or at the same layer, the number of masks used to manufacture a display apparatus may be reduced.

Next, the buffer layer 101 may be formed. The buffer layer 101 may cover the first wiring WL1, the second wiring WL2, and the first capacitor electrode CE1.

In one or more embodiments, the first wiring WL1, the second wiring WL2, the first capacitor electrode CE1, and the buffer layer 101 may be formed before a semiconductor layer is formed.

Referring to FIGS. 6B through 6I, the semiconductor layer ACT including an oxide semiconductor and the metal layer M may be formed. Also, the third semiconductor layer ACT3 and the third metal layer M3 for the second capacitor electrode CE2 may be formed. A process of forming the second capacitor electrode CE2 is similar to that of the semiconductor layer ACT and the metal layer M of the transistor, and thus, the semiconductor layer ACT and the metal layer M will be primarily described.

The semiconductor layer ACT and the third semiconductor layer ACT3 may be formed on the buffer layer 101. The metal layer M and the third metal layer M3 may be formed on the semiconductor layer ACT and the third semiconductor layer ACT.

The semiconductor layer ACT may include the channel semiconductor layer ACT0, the first semiconductor layer ACT1, and the second semiconductor layer ACT2. The channel semiconductor layer ACT0 may be located between the first semiconductor layer ACT1 and the second semiconductor layer ACT2. Each of the first semiconductor layer ACT1 and the second semiconductor layer ACT2 may extend from the channel semiconductor layer ACT0 to an edge of the semiconductor layer ACT. For example, the first semiconductor layer ACT1 and the second semiconductor layer ACT2 may extend to edges at opposite sides of the semiconductor layer ACT with the channel semiconductor layer ACT0 therebetween.

The first semiconductor layer ACT1 may extend from the first channel semiconductor layer ACT0 in a first direction (e.g., −x direction of FIG. 5A). The second semiconductor layer ACT2 may extend from the channel semiconductor layer ACT0 in a second direction (e.g., x direction of FIG. 5A) opposite the first direction. For example, the first semiconductor layer ACT1 and the second semiconductor layer ACT2 may extend in different directions from the channel semiconductor layer ACT0.

The first metal layer M1 may be located on the first semiconductor layer ACT1, and the second metal layer M2 may be located on the second semiconductor layer ACT2.

The third metal layer M3 may be located on the third semiconductor layer ACT3.

Referring to FIG. 6B, a first layer L1 including an oxide semiconductor may be formed. The first layer L1 may be formed on the buffer layer 101. The first layer L1 may include a Zn-oxide-based material such as Zn-oxide, In—Zn oxide, or Ga—In—Zn oxide. In one or more embodiments, the first layer L1 may include an In—Ga—Zn—O(IGZO), In—Sn—Zn—O(ITZO), or In—Ga—Sn—Zn—O(IGTZO) semiconductor containing a metal such as indium (In), gallium (Ga), or stannum (Sn) in ZnO.

Referring to FIG. 6C, a second layer L2 including a metal material may be located on the first layer L1. The second layer L2 may cover (e.g., completely cover) the first layer L1.

Referring to FIG. 6D, a photoresist PR may be formed. The photoresist PR may be formed on the second layer L2. The photoresist PR may be formed by applying a photoresist layer and performing exposure and development processes. A multi-tone mask, a half-tone mask, or a slit mask may be used to expose the photoresist layer. When the multi-tone mask is used, the photoresist PR may be formed so that the photoresist PR has different thicknesses. Accordingly, when a stepped portion exists on a layer to which the photoresist PR is applied, the photoresist PR may have different thicknesses so that thicknesses of the photoresist PR from the layer to which the photoresist PR is applied are the same regardless of the stepped portion.

The photoresist PR may overlap a portion of the first layer L1 which is to be a semiconductor layer of the transistor. Also, a part of the photoresist PR may overlap a portion of the second layer L2 where a metal layer of the transistor is to be formed. The photoresist PR may include a channel photoresist region CPR, a first photoresist region PR1, and a second photoresist region PR2. The channel photoresist region CPR may overlap a portion of the first layer L1 which is to be a channel semiconductor layer of the semiconductor layer. The first photoresist region PR1 may overlap a portion of the first layer L1 which is to be a first semiconductor layer of the semiconductor layer. Also, the first photoresist region PR1 may overlap a portion of the second layer L2 which is to be a first metal layer. The second photoresist region PR2 may overlap a portion of the first layer L1 which is to be a second semiconductor layer of the semiconductor layer. Also, the second photoresist region PR2 may overlap a portion of the second layer L2 which is to be a second metal layer. The second photoresist region PR2 is similar to the first photoresist region PR1, and thus, the first photoresist region PR1 will be primarily described in more detail.

The first photoresist region PR1 may have a first thickness t1, and the channel photoresist region CPR may have a second thickness t2. The first thickness t1 may be a maximum distance from a bottom surface (e.g., a surface in the −z direction of FIG. 6D) of the first photoresist region PR1 in the first photoresist region PR1 to a top surface (e.g., a surface in the z direction of FIG. 6D) of the photoresist PR opposite to the bottom surface of the photoresist PR. The second thickness t2 may be a maximum distance from the bottom surface of the photoresist PR in the channel photoresist region CPR to the top surface of the photoresist PR. The second thickness t2 may be less than the first thickness t1. In one or more embodiments, the first thickness t1 of the first photoresist region PR1 and the second thickness t2 of the channel photoresist region CPR may be measured in a thickness direction of the substrate 100.

Referring to FIG. 6E, the second layer L2 may be etched. In one or more embodiments, the second layer L2 may be wet-etched. The second layer L2 overlapping the photoresist PR may not be etched. In one or more embodiments, the second layer L2 may be over-etched. Accordingly, the second layer L2 overlapping an edge of the photoresist PR may be at least partially removed.

Referring to FIG. 6F, the photoresist PR may be etched. The photoresist PR may be dry-etched. For example, the photoresist PR may be ashed. In one or more embodiments, the photoresist PR may be plasma-treated. In this case, a thickness of the photoresist PR may be reduced. Because the channel photoresist region CPR has a thickness less than that of the first photoresist region PR1, the channel photoresist region CPR may be removed.

When the photoresist PR is etched, a part of the first layer L1 may be exposed. For example, a portion removed when the second layer L2 is etched may expose the first layer L1. In one or more embodiments, when the photoresist PR is etched, an exposed portion of the first layer L1 may be doped. For example, impurities (e.g., dopants) may be added to the exposed portion of the first layer L1.

Referring to FIG. 6G, the first layer L1 may be etched. In one or more embodiments, the first layer L1 may be wet-etched. The first layer L1 overlapping the photoresist PR or overlapping the second L2 may not be etched. A doped portion of the first layer L1 may be etched. In one or more embodiments, the first layer L1 may be over-etched. Accordingly, the first layer L1 overlapping an edge of the photoresist PR1 may be at least partially removed.

Referring to FIG. 6H, the second layer L2 may then be etched. In one or more embodiments, the second layer L2 may be wet-etched. The second layer L2 overlapping the photoresist PR may not be etched. In more detail, the second layer L2 overlapping the first photoresist region PR1 and the second photoresist region PR2, remaining after the photoresist PR is etched, may not be etched. The second layer L2 overlapping the channel photoresist region CPR, removed after the photoresist PR is etched, may be etched.

In one or more embodiments, the second layer L2 may be over-etched. Accordingly, the second layer L2 overlapping an edge of the photoresist PR may be at least partially removed. Also, because the second layer L2 is etched again after the first layer L1 is etched, a portion overlapping an edge of the photoresist PR may be further removed than the first layer L1. Accordingly, a remaining portion of the second layer L2, specifically, the metal layer, may be located within an outer circumference of a remaining portion of the first layer L1, specifically, the semiconductor layer. For example, the metal layer, may be located within an outer circumference of a remaining portion of the first layer L1, specifically, the semiconductor layer in a plan view.

Referring to FIG. 6I, the photoresist may be stripped. In the present embodiment, the first metal layer M1 and the second metal layer M2 may be formed on the first semiconductor layer ACT1 and the second semiconductor layer ACT2. Accordingly, the first semiconductor layer ACT1 and the second semiconductor layer ACT2 may be conductive through the first metal layer M1 and the second metal layer M2 without being doped regardless of a subsequent process. Also, because the first semiconductor layer ACT1 and the second semiconductor layer ACT2 do not need to be doped in the subsequent process, a degree of freedom of the subsequent process may increase.

Referring to FIG. 6J, the first inorganic insulating layer 103 may be formed. The first inorganic insulating layer 103 may be formed by using chemical vapor deposition. The first inorganic insulating layer 103 may continuously extend. In one or more embodiments, the first inorganic insulating layer 103 may cover the semiconductor layer ACT and the metal layer M.

In one or more embodiments, the first inorganic insulating layer 103 may include silicon oxide (SiO2). In this case, the first inorganic insulating layer 103 may prevent or reduce external materials from penetrating into the semiconductor layer ACT.

Referring to FIG. 6K, the first contact hole CNT1, the second contact hole CNT2, the first hole 103H1, and the second hole 103H2 may be formed in the first inorganic insulating layer 103. Also, the first buffer layer hole 101H1 and the second buffer layer hole 101H2 may be formed in the buffer layer 101. The first buffer layer hole 101H1 may overlap the first wiring WL1 and may expose the first wiring WL1. The second buffer layer hole 101H2 may overlap the first capacitor electrode CE1 and may expose the first capacitor electrode CE1. The first contact hole CNT1 may overlap the first semiconductor layer ACT1 and may expose the first semiconductor layer ACT1. The second contact hole CNT2 may overlap the second semiconductor layer ACT2 and may expose the second semiconductor layer ACT2. The first hole 103H1 may overlap and be connected to the first buffer layer hole 101H1. The second hole 103H2 may overlap and be connected to the second buffer layer hole 101H2.

Referring to FIG. 6L, a gate metal layer ML may be formed. The gate metal layer ML may be entirely formed. The gate metal layer ML may include a conductive material such as molybdenum (Mo), aluminum (Al), copper (Cu), or titanium (Ti), and may have a single-layer structure or a multi-layer structure including the above material. In one or more embodiments, the gate metal layer ML may include a transparent conductive material. The gate metal layer ML may include a conductive oxide such as indium tin oxide (ITO), indium zinc oxide (IZO), zinc oxide (ZnO), indium oxide (In2O3), indium gallium oxide (IGO), or aluminum zinc oxide (AZO). In one or more embodiments, the gate metal layer ML may include a first gate metal layer ML1, a second gate metal layer ML2, and a third gate metal layer ML3. The first gate metal layer ML1 may include titanium (Ti). The second gate metal layer ML2 may be located on the first gate metal layer ML1. The second gate metal layer ML2 may include copper (Cu). The third gate metal layer ML3 may be located on the second gate metal layer ML2. The third gate metal layer ML3 may include indium tin oxide (ITO). In one or more embodiments, the third gate metal layer ML3 may not be provided.

Referring to FIG. 6M, a gate photoresist GPR may be formed. A plurality of gate photoresists GPR may be provided. The plurality of gate photoresists GPR may overlap portions of the gate metal layer ML where a first electrode, a second electrode, and a gate electrode are to be formed. The gate photoresists GPR may be formed by applying a photoresist layer and performing exposure and development processes.

Referring to FIG. 6N, the gate metal layer ML may be etched. In one or more embodiments, the gate metal layer ML may be wet-etched. Portions of the gate metal layer ML overlapping the plurality of gate photoresists GPR may not be etched, to become the first electrode E1, the second electrode E2, and the gate electrode GE. In one or more embodiments, the gate metal layer ML overlapping an edge of the gate photoresist GPR may be at least partially removed. In other words, the gate metal layer ML may be over-etched.

The first electrode E1 may overlap the first semiconductor layer ACT1 and the first metal layer M1, and may be connected (e.g., electrically connected) to the first metal layer M1 and the first semiconductor layer ACT1 through the first contact hole CNT1. The second electrode E2 may overlap the second semiconductor layer ACT2 and the second metal layer M2, and may be connected (e.g., electrically connected) to the second metal layer M2 and the second semiconductor layer ACT2 through the second contact hole CNT2. In one or more embodiments, the first electrode E1 may entirely overlap the first contact hole CNT1 in a plan view. The second electrode E2 may entirely overlap the second contact hole CNT2 in a plan view. The gate electrode GE may overlap the channel semiconductor layer ACT0.

Referring to FIG. 6O, the gate photoresist GPR may be stripped.

Referring to FIG. 6P, the second inorganic insulating layer 105 may be formed. The second inorganic insulating layer 105 may be formed by using chemical vapor deposition. The second inorganic insulating layer 105 may cover the first electrode E1, the second electrode E2, and the gate electrode GE. In one or more embodiments, the second inorganic insulating layer 105 may continuously extend.

Referring to FIG. 6Q, the organic insulating layer 107 may be formed. The organic insulating layer 107 may be formed on the second inorganic insulating layer 105. The organic insulating layer 107 may be entirely formed.

Referring to FIG. 6R, the organic insulating layer hole 107H may be formed. First, a mask may be located on the organic insulating layer 107. Next, the organic insulating layer 107 may be exposed and developed. In one or more embodiments, the organic insulating layer hole 107H overlapping the second electrode E2 may be formed.

Also, the second inorganic insulating layer 105 may be etched to form the lower hole 105H. The lower hole 105H may overlap the organic insulating layer hole 107H. The lower hole 105H may overlap the second electrode E2 and may expose the second electrode E2. In one or more embodiments, when the second inorganic insulating layer 105 is etched, a part of the organic insulating layer 107 may be etched.

The organic insulating layer hole 107H and the lower hole 105H may be formed by using the same mask. Accordingly, the number of masks used to form the display apparatus may be reduced.

Referring to FIG. 6S, the pixel electrode 121 may be formed. The pixel electrode 121 may overlap the organic insulating layer hole 107H. The pixel electrode 121 may be connected (e.g., electrically connected) to any one of the first electrode E1 and the second electrode E2 through the lower hole 105H and the organic insulating layer hole 107H. In one or more embodiments, when the pixel electrode 121 is formed, a wet etching process and/or a dry etching process may be used. In this case, a part of the organic insulating layer 107 may be removed. Next, a pixel-defining layer, a display element, and an encapsulation layer may be formed to manufacture a light-emitting panel.

As such, because the display apparatus according to one or more embodiments has a relatively simple stacked structure, the display apparatus may be manufactured with a small number of masks.

FIG. 7A is an enlarged view illustrating a portion F of the light-emitting panel 10 of FIG. 3 according to one or more embodiments. FIG. 7B is an enlarged view illustrating a portion G of FIG. 7A according to one or more embodiments. FIG. 7C is an enlarged view illustrating the portion G of FIG. 7A according to a comparative example.

Referring to FIG. 7A, the light-emitting panel 10 may include the pixel circuit PC, the control line CL, the data line DL, the initialization-sensing line ISL, the driving voltage line VDL, the common voltage line VSL, and a connection electrode CNE. The pixel circuit PC may include a first pixel circuit PC1, a second pixel circuit PC2, and a third pixel circuit PC3. The first pixel circuit PC1, the second pixel circuit PC2, and the third pixel circuit PC3 may respectively drive a first display element, a second display element, and a third display element. The first pixel circuit PC1 may include the first transistor T1, the second transistor T2, the third transistor T3, and a first storage capacitor Cst1. The second pixel circuit PC2 may include three transistors and a second storage capacitor Cst2. The third pixel circuit PC3 may include three transistors and a third storage capacitor Cst3. Because the second pixel circuit PC2 and the third pixel circuit PC3 are similar to the first pixel circuit PC1, the first pixel circuit PC1 will be primarily described in more detail.

The scan line SL and the control line CL may extend in the x direction. In one or more embodiments, the scan line SL may include a first branch SL-B extending in a direction, for example, the −y direction, intersecting a direction (e.g., the x direction) in which the scan line SL extends. In one or more embodiments, the control line CL may include a second branch CL-B extending in a direction, for example, the y direction, intersecting a direction (e.g., the x direction) in which the control line CL extends.

The data line DL, the initialization-sensing line ISL, the driving voltage line VDL, and the common voltage line VSL may extend in the y direction. In one or more embodiments, the data line DL may include a first data line DL1, a second data line DL2, and a third data line DL3. The first data line DL1, the second data line DL2, and the third data line DL3 may respectively apply data signals to the first pixel circuit PC1, the second pixel circuit PC2, and the third pixel circuit PC3.

The driving voltage line VDL and the data line DL may be located between the initialization-sensing line ISL and the common voltage line VSL. The driving voltage line VDL may be located between the initialization-sensing line ISL and the data line DL. The data line DL may be located between the driving voltage line VDL and the common voltage line VSL. The initialization-sensing line ISL and the driving voltage line VDL may be located on one side (e.g., the left side) of the first storage capacitor Cst1, the second storage capacitor Cst2, and the third storage capacitor Cst3, and the data line DL and the common voltage line VSL may be located on the other side (e.g., the right side). Through this structure, a space of the light-emitting panel 10 may be efficiency used.

In a plan view, the first storage capacitor Cst1, the second storage capacitor Cst2, and the third storage capacitor Cst3 may be arranged along one direction, for example, the y direction. The first storage capacitor Cst1 may be closest (e.g., closest in the −y direction) to the scan line SL extending in the x direction, and the third storage capacitor Cst3 may be farthest (e.g., farthest in the −y direction) from the scan line SL extending in the x direction. The second storage capacitor Cst2 may be located between the first storage capacitor Cst1 and the third storage capacitor Cst3.

The first transistor T1 may include a channel region A1 of the first transistor T1, a first region R1-1 of the first transistor T1, a second region R1-2 of the first transistor T1, and a first gate electrode G1. The channel region A1 of the first transistor T1 may be located between the first region R1-1 of the first transistor T1 and the second region R1-2 of the first transistor T1. Any one of the first region R1-1 of the first transistor T1 and the second region R1-2 of the first transistor T1 may correspond to a source region, and the other may correspond to a drain region.

In one or more embodiments, the first region R1-1 of the first transistor T1, the channel region A1 of the first transistor T1, and the second region R1-2 of the first transistor T1 may include a semiconductor layer, specifically, a first semiconductor layer of the first transistor T1, a channel semiconductor layer of the first transistor T2, and a second semiconductor layer of the first transistor T1. Also, the first region R1-1 of the first transistor T1 and the second region R1-2 of the first transistor T1 may further include the metal layer M located on the semiconductor layer, for example, respectively, a first metal layer M11 of the first transistor T1 and a second metal layer M12 of the first transistor T1. In one or more embodiments, no metal layer may be formed on the semiconductor layer of the channel region A1 of the first transistor T1.

The first gate electrode G1 may overlap the channel region A1 of the first transistor T1. Any one of the first region R1-1 of the first transistor T1 and the second region R1-2 of the first transistor T1 may be connected to the driving voltage line VDL, and the other of the first region R1-1 of the first transistor T1 and the second region R1-2 of the first transistor T1 may be connected to the first storage capacitor Cst1. For example, the first region R1-1 of the first transistor T1 may be connected to the driving voltage line VDL, and the second region R1-2 of the first transistor T1 may be connected to the first storage capacitor Cst1. The first region R1-1 of the first transistor T1 may be connected to a first connection electrode CNE1 through a contact hole of an insulating layer. The first connection electrode CNE1 may be connected to the driving voltage line VDL through another contact hole of the insulating layer. The second region R1-2 of the first transistor T1 may be connected to a second connection electrode CNE2 through a contact hole of an insulating layer. The second connection electrode CNE2 may be connected to the first storage capacitor Cst1 through another contact hole of the insulating layer.

The second transistor T2 may include a channel region A2 of the second transistor T2, a first region R2-1 of the second transistor T2, a second region R2-2 of the second transistor T2, and a second gate electrode G2. The channel region A2 of the second transistor T2 may be located between the first region R2-1 of the second transistor T2 and the second region R2-2 of the second transistor T2. Any one of the first region R2-1 of the second transistor T2 and the second region R2-2 of the second transistor T2 may correspond to a source region, and the other may correspond to a drain region.

In one or more embodiments, the first region R2-1 of the second transistor T2, the channel region A2 of the second transistor T2, and the second region R2-2 of the second transistor T2 may include a semiconductor layer, specifically, a first semiconductor layer of the second transistor T2, a channel semiconductor layer of the second transistor T2, and a second semiconductor layer of the second transistor T2. Also, the first region R2-1 of the second transistor T2 and the second region R2-2 of the second transistor T2 may further include the metal layer M located on the semiconductor layer, for example, a first metal layer M21 of the second transistor T2 and a second metal layer M22 of the second transistor T2. In one or more embodiments, no metal layer may be located on the semiconductor layer of the channel region A2 of the second transistor T2.

The second gate electrode G2 may overlap the channel region A2 of the second transistor T2. The second gate electrode G2 may correspond to a part of the scan line SL, for example, a part of the first branch SL-B. As described above, the first branch SL-B may correspond to a gate electrode of the second transistor T2 of each of the first pixel circuit PC1, the second pixel circuit PC2, and the third pixel circuit PC3. The first branch SL-B may extend between the first storage capacitor Cst1 and the data line DL.

Any one of the first region R2-1 of the second transistor T2 and the second region R2-2 of the second transistor T2 may be connected to the first data line DL1, and the other of the first region R2-1 of the second transistor T2 and the second region R2-2 of the second transistor T may be connected (e.g., electrically connected) to the first storage capacitor Cst1. For example, the second region R2-2 of the second transistor T2 may be connected to the first data line DL1, and the first region R2-1 of the second transistor T2 may be connected to the first storage capacitor Cst1. The second region R2-2 of the second transistor T2 may be connected to a third connection electrode CNE3 through a contact hole of an insulating layer. The third connection electrode CNE3 may be connected to the first data line DL1 through another contact hole of the insulating layer. The first region R2-1 of the second transistor T2 may extend to the second capacitor electrode CE2 of the first storage capacitor Cst1. In other words, the first region R2-1 of the second transistor T2 may be integrally formed with the second capacitor electrode CE2.

The third transistor T3 may include a channel region A3 of the third transistor T3, a first region R3-1 of the third transistor T3, a second region R3-2 of the third transistor T3, and a third gate electrode G3. The channel region A3 of the third transistor T3 may be located between the first region R3-1 of the third transistor T3 and the second region R3-2 of the third transistor T3. Any one of the first region R3-1 of the third transistor T3 and the second region R3-2 of the third transistor T3 may correspond to a source region, and the other may correspond to a drain region.

In one or more embodiments, the first region R3-1 of the third transistor T3, the channel region A3 of the third transistor T3, and the second region R3-2 of the third transistor T3 may include a semiconductor layer, specifically, a first semiconductor layer of the third transistor T3, a channel semiconductor layer of the third transistor T3, and a second semiconductor layer of the third transistor T3. Also, the first region R3-1 of the third transistor T3 and the second region R3-2 of the third transistor T3 may further include the metal layer M located on the semiconductor layer, for example, a first metal layer M31 of the third transistor T3 and a second metal layer M32 of the third transistor T3. In one or more embodiments, no metal layer M may be located on the semiconductor layer of the channel region A3 of the third transistor T3.

The third gate electrode G3 may overlap the channel region A3 of the third transistor T3. The third gate electrode G3 may correspond to a part of the control line CL, for example, a part of the second branch CL-B. As described above, the second branch CL-B may correspond to a gate electrode of the third transistor T3 of each of the first pixel circuit PC1, the second pixel circuit PC2, and the third pixel circuit PC3. The second branch CL-B may extend between the driving voltage line VDL and the initialization-sensing line ISL.

Any one of the first region R3-1 of the third transistor T3 and the second region R3-2 of the third transistor T3 may be connected to the first storage capacitor Cst1, and the other of the first region R3-1 of the third transistor T3 and the second region R3-2 of the third transistor T3 may be connected to the initialization-sensing line ISL. For example, the second region R3-2 of the third transistor T3 may be connected to the first storage capacitor Cst1, and the first region R3-1 of the third transistor T3 may be connected to the initialization-sensing line ISL. The second region R3-2 of the third transistor T3 may be connected to the second connection electrode CNE2 through a contact hole of an insulating layer. In this case, the second connection electrode CNE2 may extend to the third capacitor electrode CE3. In other words, the second connection electrode CNE2 may be integrally formed with the third capacitor electrode CE3.

In one or more embodiments, the third capacitor electrode CE3 may have a size large enough to completely cover the second capacitor electrode CE2. For example, because the first region R2-1 of the second transistor T2 includes a metal layer and has a conductive function, the semiconductor layer of the first region R2-1 of the second transistor T2 may not be doped. Accordingly, the third capacitor electrode CE3 may be formed to completely cover the first region R2-1 of the second transistor T2.

The second region R3-2 of the third transistor T3 may extend to the second region R1-2 of the first transistor T1. In other words, the second region R3-2 of the third transistor T3 may be integrally formed with the second region R1-2 of the first transistor T1. The first region R3-1 of the third transistor T3 may be connected to a fourth connection electrode CNE4 through a contact hole of an insulating layer. The fourth connection electrode CNE4 may be connected to the initialization-sensing line ISL through another contact hole of the insulating layer.

The first storage capacitor Cst1 may include at least three electrodes. In one or more embodiments, the first storage capacitor Cst1 may include the first capacitor electrode CE1, the second capacitor electrode CE2, and a third capacitor electrode CE3. The first capacitor electrode CE1 may be connected to the second connection electrode CNE2 through a contact hole of an insulating layer. The second capacitor electrode CE2 may be integrally formed with the first region R2-1 of the second transistor T2, and may be connected to the first gate electrode G1 through a contact hole of an insulating layer. The third capacitor electrode CE3 may be integrally formed with the second connection electrode CNE2, and may be connected to the first capacitor electrode CE1. In one or more embodiments, the first storage capacitor Cst1 may further include a fourth capacitor electrode as described above. The fourth capacitor electrode may be, for example, a pixel electrode.

Each of the second storage capacitor Cst2 and the third storage capacitor Cst3 may include at least three electrodes. The second storage capacitor Cst2 and the third storage capacitor Cst3 are similar to the first storage capacitor Cst1, and thus, a detailed description thereof will not be provided.

In one or more embodiments, the common voltage line VSL and a fifth connection electrode CNE5 may be connected through a contact hole of an insulating layer. The fifth connection electrode CNE5 may extend in an extension direction of the common voltage line VSL, for example, the −y direction. Accordingly, the resistance of the common voltage line VSL may be reduced. Also, in one or more embodiments, a semiconductor layer and a fourth metal layer M4 on the semiconductor layer may be located between the common voltage line VSL and the fifth connection electrode CNE5. The fourth metal layer M4 may be connected to the fifth connection electrode CNE5 through a contact hole of an insulating layer. Accordingly, the resistance of the common voltage line VSL may be further reduced.

In one or more embodiments, the initialization-sensing line ISL and the fourth connection electrode CNE4 may be connected through a contact hole of an insulating layer. The fourth connection electrode CNE4 may extend in an extension direction of the initialization-sensing line ISL, for example, the −y direction. Accordingly, the resistance of the initialization-sensing line ISL may be reduced. Also, in one or more embodiments, the first region R3-1 of the third transistor T3 connected to the fourth connection electrode CNE4 may extend in an extension direction of the fourth connection electrode CNE4, that is, an extension direction of the initialization-sensing line ISL. In this case, an extension length of the first region R3-1 of the third transistor T3 in the −y direction may be less than an extension length of the fourth connection electrode CNE4 in the −y direction. Because the first region R3-1 of the third transistor T3 includes the metal layer M31, the resistance of the initialization-sensing line ISL may be further reduced.

In one or more embodiments, the driving voltage line VDL and the first connection electrode CNE1 may be connected through a contact hole of an insulating layer. The first connection electrode CNE1 may extend in an extension direction of the driving voltage line VDL, for example, the −y direction. Accordingly, the resistance of the driving voltage line VDL may be reduced. Also, in one or more embodiments, a semiconductor layer and a fifth metal layer M5 on the semiconductor layer may be located between the driving voltage line VDL and the first connection electrode CNE1. The fifth metal layer M5 may be connected to the first connection electrode CNE1 through a contact hole of an insulating layer. Accordingly, the resistance of the driving voltage line VDL may be further reduced.

The data line DL, the initialization-sensing line ISL, the driving voltage line VDL, the common voltage line VSL, and the first capacitor electrode CE1 may be located on or at the same layer, and may include the same material. The data line DL, the initialization-sensing line ISL, the driving voltage line VDL, the common voltage line VSL, and the first capacitor electrode CE1 may be formed by using the same process.

A first insulating layer may be located on the data line DL, the initialization-sensing line ISL, the driving voltage line VDL, the common voltage line VSL, and the first capacitor electrode CE1, and a semiconductor layer may be located on the first insulating layer. The semiconductor layer may be provided in the first region R1-1 of the first transistor T1, the channel region A1 of the first transistor T1, the second region R1-2 of the first transistor T1, the first region R2-1 of the first transistor T1, the channel region A2 of the second transistor T2, the second region R2-2 of the second transistor T2, the first region R3-1 of the third transistor T3, the channel region A3 of the third transistor T3, and the second region R3-2 of the third transistor T3. Also, the semiconductor layer may be provided on a part of the common voltage line VSL and a part of the driving voltage line VDL, as described above.

In one or more embodiments, the metal layer M may be located on the semiconductor layer. In more detail, the first metal layer M11 of the first transistor T1, the second metal layer M12 of the first transistor T1, the first metal layer M21 of the second transistor T2, the second metal layer M22 of the second transistor T2, the first metal layer M31 of the third transistor T3, and the second metal layer M32 of the third transistor T3 may be located on the first region R1-1 of the first transistor T1, the second region R1-2 of the first transistor T1, the first region R2-1 of the second transistor T2, the second region R2-2 of the second transistor T2, the first region R3-1 of the third transistor T3, and the second region R3-2 of the third transistor T3 of the semiconductor layer. For example, the metal layer M may be located on portions of the semiconductor layer, other than the channel region A1 of the first transistor T1, the channel region A2 of the second transistor T2, and the channel region A3 of the third transistor T3. Also, the fourth metal layer M4 and the fifth metal layer M5 may be located on the semiconductor layer located on the common voltage line VSL and the semiconductor layer located on the driving voltage line VDL.

Also, as described above, the second capacitor electrode CE2 may be integrally formed with the first region R2-1 of the second transistor T2. For example, in the second capacitor electrode CE2, the first semiconductor layer of the second transistor T2 may be located and the first metal layer M21 of the second transistor T2 may be located on the first semiconductor layer.

A second insulating layer may be located on the semiconductor layer and the metal layer, and the scan line SL, the control line CL, the third capacitor electrode CE3, and the connection electrode CNE may be located on the second insulating layer. In one or more embodiments, the connection electrode CNE may include the first connection electrode CNE1, the second connection electrode CNE2, the third connection electrode CNE3, the fourth connection electrode CNE4, and the fifth connection electrode CNE5. Also, as described above, the second connection electrode CNE2 may be integrally formed with the third capacitor electrode CE3.

Referring to FIG. 7B, in a plan view, a contact hole CNT may entirely overlap the second connection electrode CNE2 in a plan view. In other words, an entire outer circumference of the contact hole CNT may overlap the second connection electrode CNE2. When the second region R3-2 of the third transistor does not include the second metal layer M32 of the third transistor, as shown in FIG. 7C, the contact hole CNT may be formed not to entirely overlap the second connection electrode CNE2, and impurities (e.g., dopants) may be added and doped through a portion of the contact hole CNT which does not overlap the second connection electrode CNE2 in a plan view. However, in this case, in a patterning process of forming the second connection electrode CNE2, the second region R3-2 of the third transistor which overlaps the portion of the contact hole CNT which does not overlap the second connection electrode CNE2 may be damaged or removed. Also, the resistance of the second region R3-2 of the third transistor may be increased. Also, because the second connection electrode CNE2 and the second region R3-2 of the third transistor are connected through at least a part of the contact hole CNT, stability may not be achieved. In the present embodiment, the second region R3-2 of the third transistor may include the second metal layer M32 of the third transistor on the second semiconductor layer of the third transistor. Accordingly, in a subsequent process, the contact hole CNT may be entirely covered by the second connection electrode CNE2 without being partially exposed. Also, because the second region R3-2 of the third transistor is conductive through the metal layer having lower resistance than that of the semiconductor layer, the second region R3-2 of the third transistor may have low resistance. Also, because the second region R3-2 of the third transistor may be prevented or substantially prevented from being damaged or removed, the second region R3-2 of the third transistor may maintain low resistance.

Although the third transistor has been primarily described, the disclosure is not limited thereto, and a contact hole of each of the first transistor and the second transistor may also entirely overlap a connection electrode.

The display apparatus may have a simple stacked structure and may have improved reliability. In one or more embodiments, FIG. 5A is a cross-sectional view illustrating the third transistor T3 taken along the line A-B of FIG. 7A. For example, the transistor TRT of FIG. 5A may be the third transistor T3, and the channel semiconductor layer ACT0, the first semiconductor layer ACT1, and the second semiconductor layer ACT2 may be respectively a channel semiconductor layer of the third transistor T3, a first semiconductor layer of the third transistor T3, and a second semiconductor layer of the third transistor T3. Also, the first electrode E1 may be the fourth connection electrode CNE4, the second electrode E2 may be the second connection electrode CNE2, and the gate electrode GE may be the third gate electrode G3. Also, the first wiring WL1 may be the initialization-sensing line ISL, and the second wiring WL2 may be the driving voltage line VDL.

However, this is for convenience of explanation, and the disclosure is not limited thereto. In more detail, although the first region R3-1 of the third transistor T3 and the second region R3-2 of the third transistor T3 have been described based on the third transistor T3 in FIG. 5, the transistor TRT of FIG. 5A may be the first transistor T1 or the second transistor T2, and the first region R1-1 of the first transistor T1 and the second region R1-2 of the first transistor T1 may be described based on the first transistor T1 and the second region R2-2 of the second transistor T2 and the first region R2-1 of the second transistor T2 may be described based on the second transistor T2 in FIG. 5A.

According to the embodiments, a display apparatus having a simple stacked structure and improved reliability and a method of manufacturing the display apparatus may be provided. Also, a display apparatus in which the capacity of a capacitor is secured and a method of manufacturing the display apparatus may be provided.

The effects of the disclosure are not limited to the above-mentioned effects, and other effects not mentioned herein will be clearly understood by one of ordinary skill in the art from the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by one of ordinary skill in the art that one or more suitable changes in form and details may be made therein without departing from the spirit and scope as defined by the following claims and equivalents thereof.

What is claimed is:

1. A display apparatus comprising:

a substrate;

a semiconductor layer on the substrate, formed of an oxide semiconductor, and comprising a channel semiconductor layer and a first semiconductor layer extending in a first direction from the channel semiconductor layer;

a first metal layer on the first semiconductor layer, and located in the first semiconductor layer in a plan view;

a first inorganic insulating layer covering the semiconductor layer and the first metal layer and comprising a first contact hole overlapping the first semiconductor layer and the first metal layer;

a first electrode on the first inorganic insulating layer, overlapping the first semiconductor layer and the first metal layer, and electrically connected to the first metal layer and the first semiconductor layer connected to the first metal layer through the first contact hole;

a gate electrode on the first inorganic insulating layer and overlapping the channel semiconductor layer;

a second inorganic insulating layer covering the first electrode and the gate electrode; and a display element on the second inorganic insulating layer.

2. The display apparatus of claim 1, wherein a portion of the first semiconductor layer under a region where the first metal layer is located is non- conductive.

3. The display apparatus of claim 1, wherein the first metal layer is connected to the first electrode, and wherein the first electrode is connected to a first wiring.

4. The display apparatus of claim 3, wherein the first electrode extends in an extension direction of the first wiring, and wherein the first metal layer extends in the extension direction of the first electrode.

5. The display apparatus of claim 1, wherein the first electrode covers the first contact hole entirely in a plan view.

6. The display apparatus of claim 1, wherein the first electrode and the gate electrode comprise a same material.

7. The display apparatus of claim 1, wherein the semiconductor layer further comprises a second semiconductor layer extending from the channel semiconductor layer in a second direction opposite the first direction, wherein the first inorganic insulating layer further comprises a second contact hole overlapping the second semiconductor layer, wherein the display apparatus further comprises:

a second metal layer on the second semiconductor layer and located in the second semiconductor layer in a plan view; and a second electrode on the second inorganic insulating layer, overlapping the second semiconductor layer and the second metal layer, and electrically connected to the second metal layer and the second semiconductor layer connected to the second metal layer through the second contact hole, and wherein one of the first electrode and the second electrode is electrically connected to the display element through a hole formed in the second inorganic insulating layer.

8. The display apparatus of claim 1, further comprising:

a buffer layer between the substrate and the semiconductor layer;

a first capacitor electrode between the substrate and the buffer layer; and a second capacitor electrode between the buffer layer and the first inorganic insulating layer and overlapping the first capacitor electrode, wherein the second capacitor electrode comprises:

a first layer comprising a same material as a material of the semiconductor layer; and a second layer on the first layer and comprising a same material as a material of the first metal layer.

9. The display apparatus of claim 8, wherein a portion of the first layer under the second layer is non-conductive.

10. The display apparatus of claim 8, further comprising a third capacitor electrode between the buffer layer and the second inorganic insulating layer and overlapping the second capacitor electrode, wherein the third capacitor electrode comprises a same material as a material of the gate electrode.

11. The display apparatus of claim 10, wherein the third capacitor electrode is electrically connected to the first capacitor electrode.

12. The display apparatus of claim 10, further comprising a fourth capacitor electrode on the second inorganic insulating layer and overlapping the third capacitor electrode, wherein the display element comprises a pixel electrode on the second inorganic insulating layer, and wherein the fourth capacitor electrode comprises a same material as a material of the pixel electrode.

* * * * *